(12) United States Patent
Tang et al.

(10) Patent No.: US 10,381,352 B1
(45) Date of Patent: Aug. 13, 2019

(54) INTEGRATED ASSEMBLIES WHICH INCLUDE CARBON-DOPED OXIDE, AND METHODS OF FORMING INTEGRATED ASSEMBLIES

(71) Applicant: Micron Technology, Inc., Boise, ID (US)

(72) Inventors: Sanh D. Tang, Kuna, ID (US); Silvia Borsari, Boise, ID (US); Sau Ha Cheung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/971,210

(22) Filed: May 4, 2018

(51) Int. Cl.
  *H01L 27/108* (2006.01)
  *H01L 21/02* (2006.01)
  *H01L 23/528* (2006.01)

(52) U.S. Cl.
  CPC .. *H01L 27/10823* (2013.01); *H01L 21/02126* (2013.01); *H01L 23/5283* (2013.01); *H01L 27/1085* (2013.01); *H01L 27/10873* (2013.01); *H01L 27/10891* (2013.01)

(58) Field of Classification Search
  CPC ........... H01L 27/10823; H01L 27/1085; H01L 27/10873; H01L 27/10891; H01L 21/02126; H01L 23/5283
  See application file for complete search history.

(56) References Cited

U.S. PATENT DOCUMENTS

| | | | | |
|---|---|---|---|---|
| 9,647,112 B1* | 5/2017 | Balakrishnan | ...... | H01L 29/7845 |
| 2007/0161169 A1* | 7/2007 | Belyansky | .......... | H01L 29/0653 |
| | | | | 438/197 |
| 2012/0012913 A1* | 1/2012 | Lee | .................. | H01L 27/10852 |
| | | | | 257/302 |
| 2015/0054063 A1* | 2/2015 | Karda | ..................... | G11C 11/40 |
| | | | | 257/329 |
| 2015/0249143 A1* | 9/2015 | Sano | ................. | H01L 29/66666 |
| | | | | 257/66 |

* cited by examiner

*Primary Examiner* — Matthew L Reames
(74) *Attorney, Agent, or Firm* — Wells St. John P.S.

(57) ABSTRACT

Some embodiments include an integrated assembly having semiconductor material structures which each have a transistor channel region, and which are over metal-containing structures. Carbon-doped oxide is adjacent regions of each of the semiconductor material structures and sidewalls of the metal-containing structures. Some embodiments include an integrated assembly having pillars of semiconductor material. Each of the pillars has four sidewalls. Two of the four sidewalls of each pillar are gated sidewalls. The other two of the four sidewalls are non-gated sidewalls. Carbon-doped silicon dioxide is adjacent and directly against the non-gated sidewalls. Some embodiments include a method of forming an integrated assembly. Rails of semiconductor material are formed. A layer of carbon-doped silicon dioxide is formed adjacent top surfaces and sidewall surfaces of each of the rails. Trenches are formed which slice the semiconductor material of the rails into pillars. Wordlines are formed within the trenches and along the pillars.

7 Claims, 25 Drawing Sheets

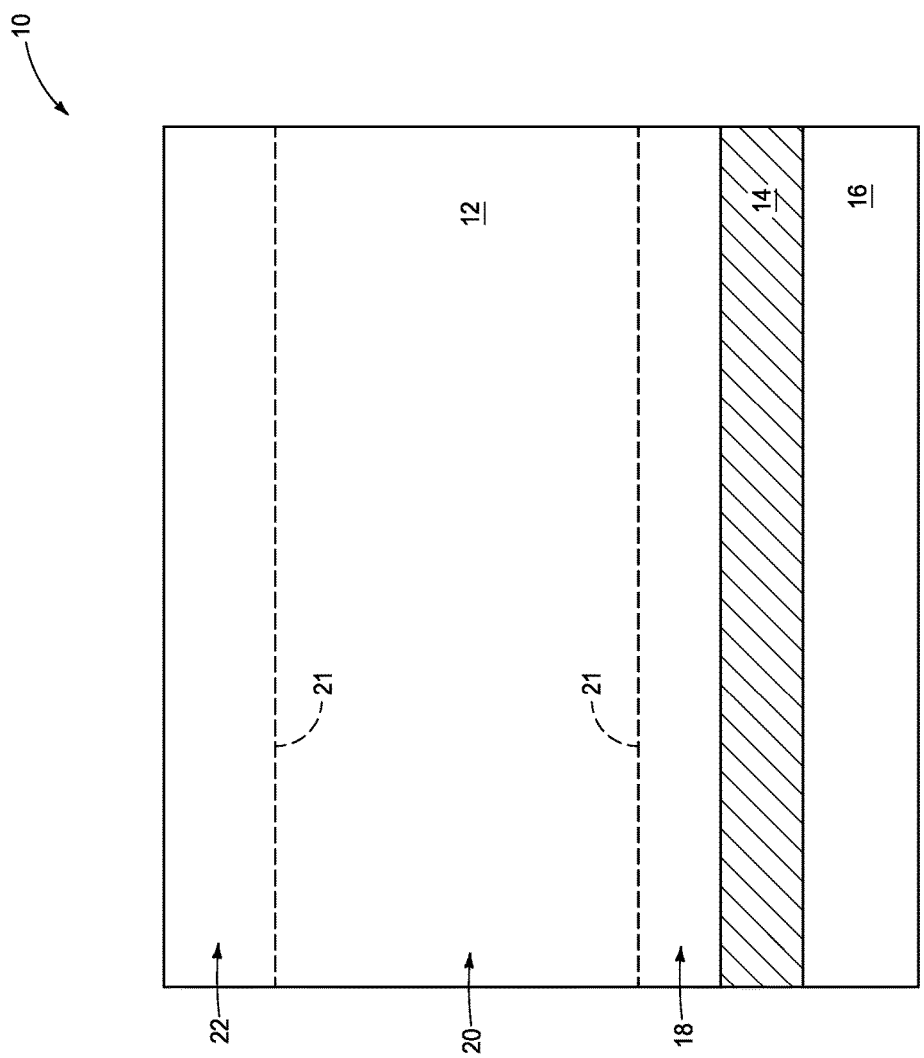

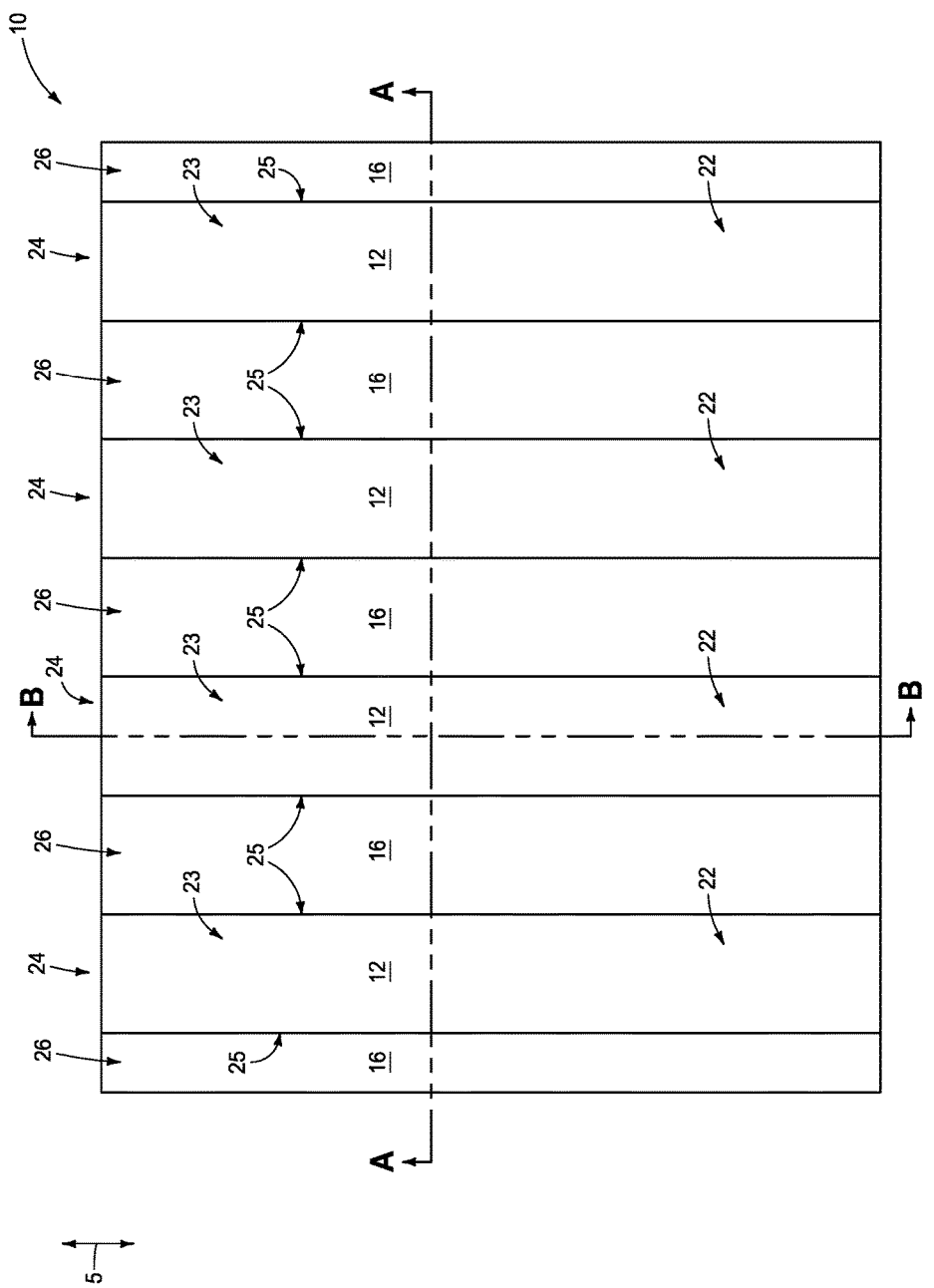

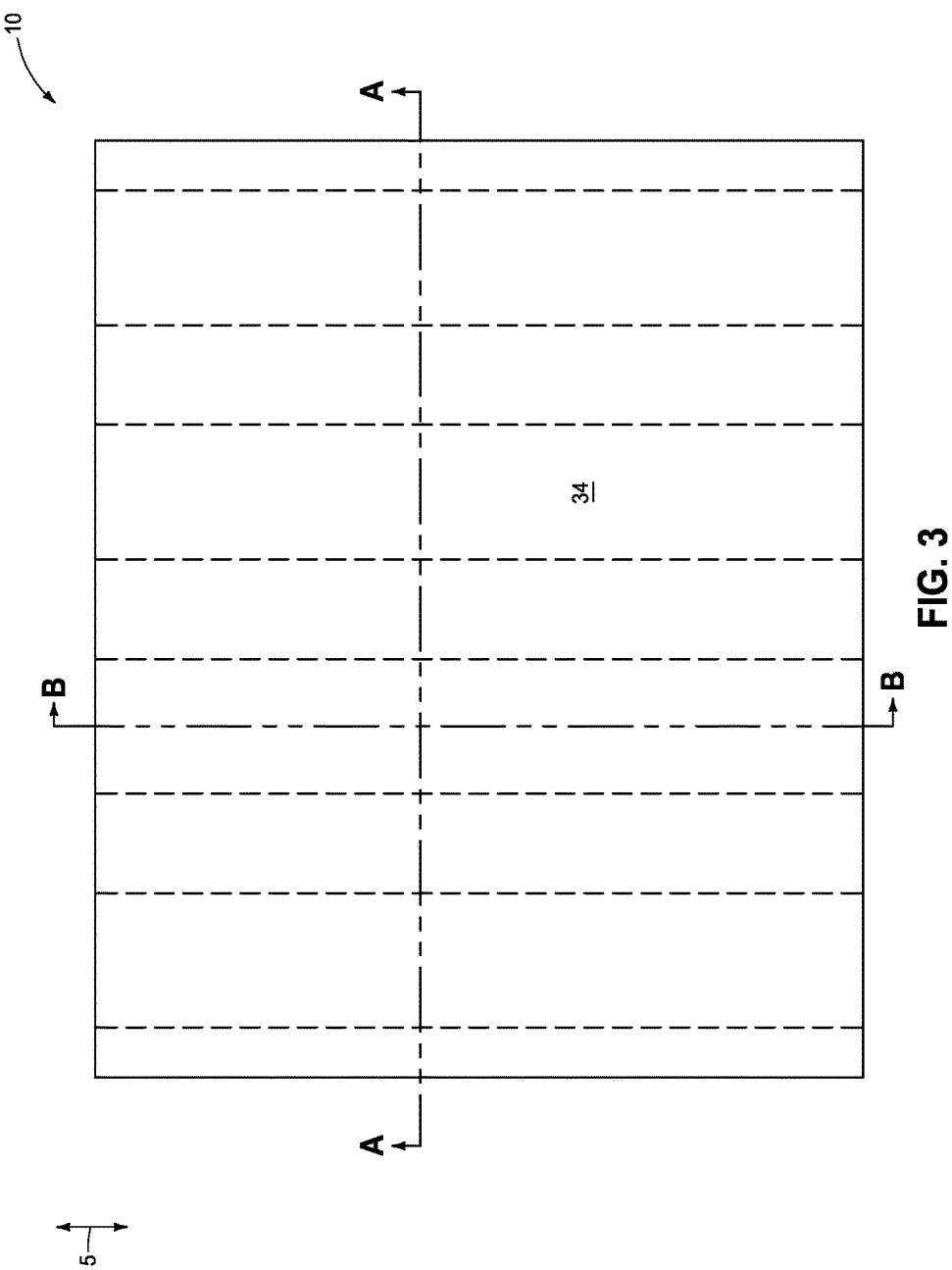

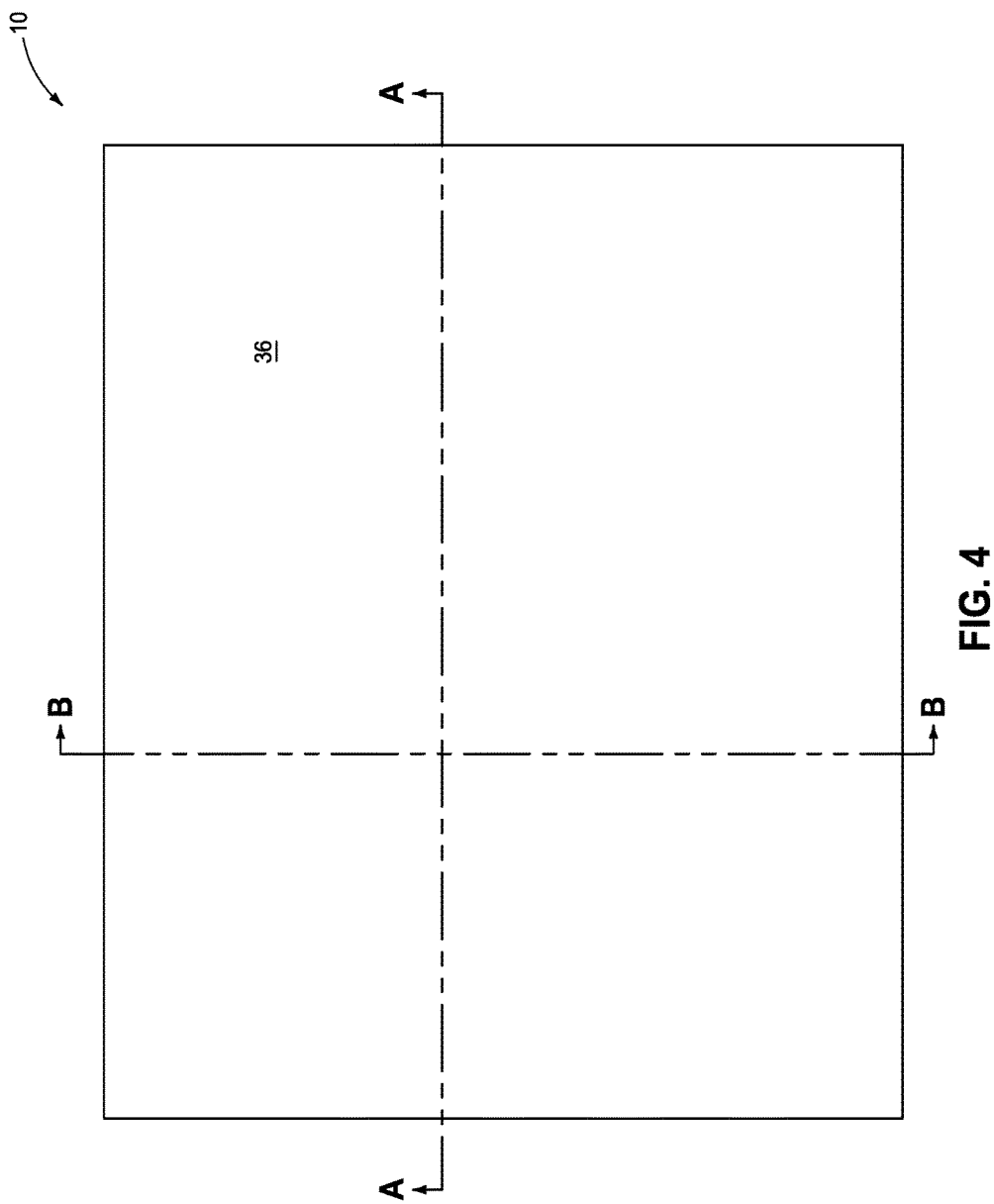

US 10,381,352 B1

INTEGRATED ASSEMBLIES WHICH INCLUDE CARBON-DOPED OXIDE, AND METHODS OF FORMING INTEGRATED ASSEMBLIES

TECHNICAL FIELD

Integrated assemblies which include carbon-doped oxide, and methods of forming integrated assemblies.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor.

The transistors associated with the memory cells may be referred to as access transistors. In some applications, the transistors may have a channel region extending vertically between a pair of source/drain regions. Such transistors may be referred to as vertical transistors. Vertical transistors may be tightly packed within a memory array, and accordingly may be suitable for high levels of integration. However, it is becoming increasingly difficult to achieve desired electrical isolation of neighboring vertical transistors with increasing levels of integration.

Conventional isolation utilizes silicon dioxide as an insulative material provided between neighboring vertical transistors. However, oxygen may problematically diffuse from the silicon dioxide into materials associated with memory arrays (e.g., metal-containing digit-line materials, metal-containing wordline materials, etc.). The oxygen may diffuse from the silicon dioxide into materials during deposition, and/or during densification with $O_2$. Accordingly, silicon nitride is provided between the bulk silicon dioxide and other materials, with the silicon nitride providing a barrier to preclude oxygen migration from the silicon dioxide into the other materials. However, the silicon nitride presents its own problems. For instance, silicon nitride traps charge, and such charge-trapping properties may become increasingly problematic with increasing levels of integration. Also, silicon nitride has a relatively high dielectric constant (greater than 7) which may increase the likelihood of parasitic capacitance between adjacent conductive features. Further, it is generally difficult to form a continuous layer of silicon nitride having a thickness of less than 30 angstroms (Å), which can limit scalability of insulative structures comprising silicon nitride. Finally, silicon nitride may induce undesired stresses if the silicon nitride is provided directly against a semiconductor material. Accordingly, the silicon nitride is generally spaced from semiconductor materials by thin layers of silicon dioxide (referred to as pad oxide). Such adds additional processing and associated costs; and further may problematically lead to silicon dioxide being provided in locations where oxygen diffusion would best be avoided.

It would be desirable to develop architectures which alleviate the above-discussed difficulties, and to develop methods of forming such architectures.

BRIEF DESCRIPTION OF THE DRAWINGS

FIGS. 1-8 illustrate example process stages of an example method for fabricating an example integrated assembly.

FIGS. 1A-8A are diagrammatic cross-sectional side views along the lines A-A of FIGS. 1-8, respectively.

FIGS. 1B-8B are diagrammatic cross-sectional side views along the lines B-B of FIGS. 1-8, respectively.

DETAILED DESCRIPTION OF THE ILLUSTRATED EMBODIMENTS

Some embodiments include integrated assemblies in which carbon-doped oxide (e.g., carbon-doped silicon dioxide) is provided adjacent digit-line material, and adjacent semiconductor material structures. The semiconductor material structures may be comprised by transistors (e.g., vertical transistors), and accordingly may comprise transistor channel regions. The carbon-doped oxide may be utilized as a barrier layer between bulk silicon dioxide and the digit-line material, with such barrier layer being suitable to alleviate (or even entirely preclude preclude) oxygen migration from the bulk silicon dioxide into conductive materials (e.g., metal-containing materials) of digit-line structures. Additionally, or alternatively, carbon-doped oxide may be provided over wordline material (e.g., metal-containing wordline material) to protect such wordline material. Example embodiments are described with reference to FIGS. 1-9.

Figure 1:
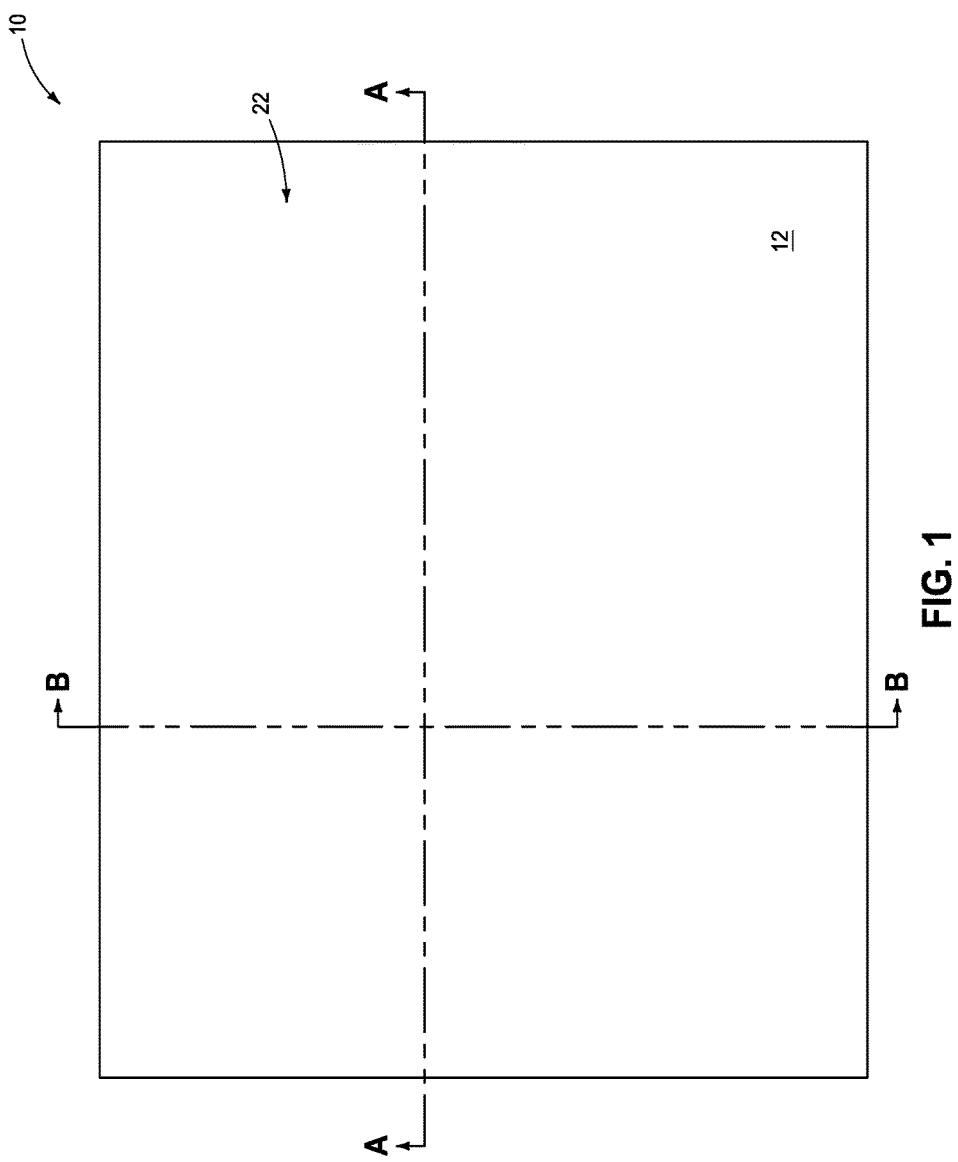
FIGS. 1-8 are diagrammatic top views of a region of an example construction.
Figure 1A:
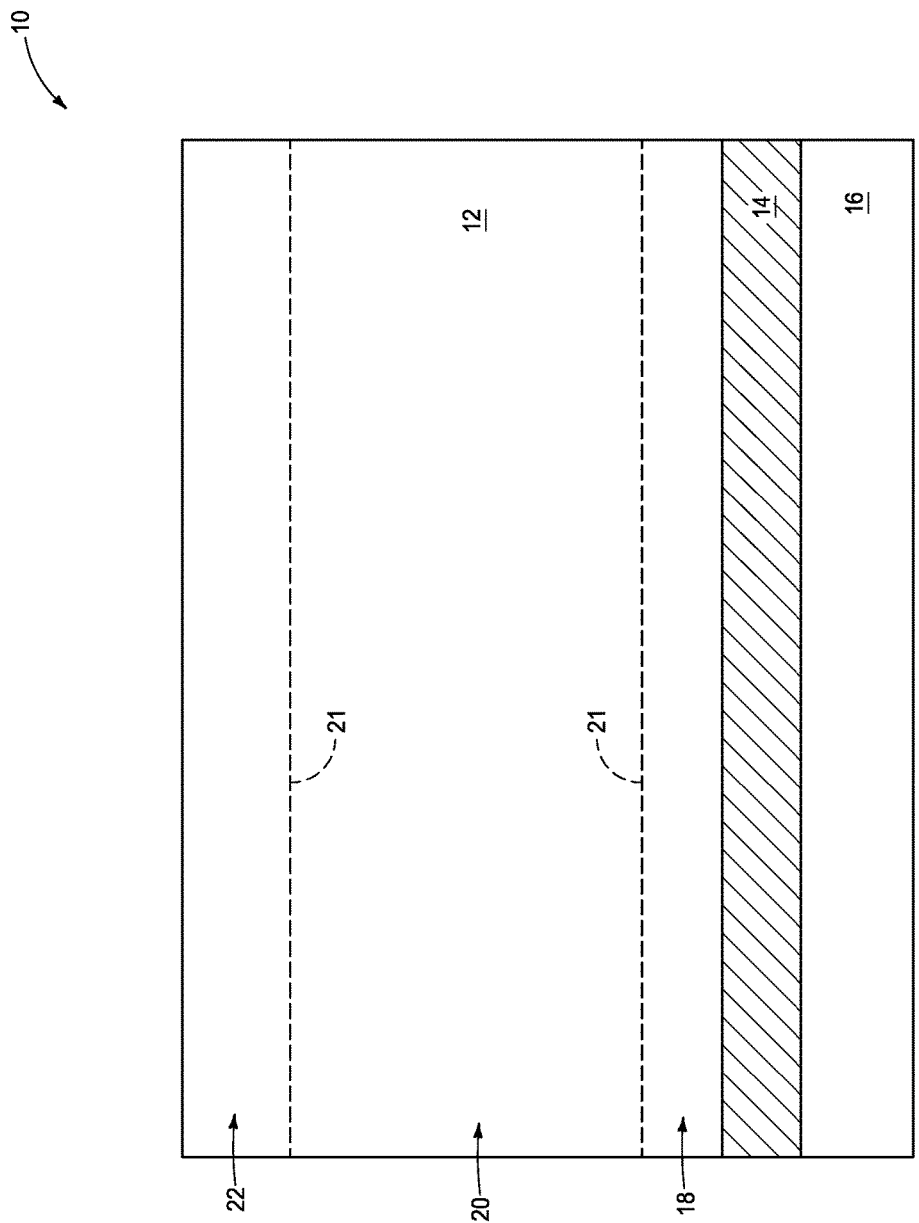

Referring to FIGS. 1-1B, a construction 10 includes semiconductor material 12 over conductive material 14, which in turn is over insulative material 16.

The semiconductor material 12 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 12 may comprise, consist essentially of, or consist of silicon. The silicon may be in any suitable form; and in some embodiments may be monocrystalline and/or polycrystalline.

The semiconductor material 12 is shown to comprise three regions 18, 20 and 22; with boundaries between such regions being diagrammatically illustrated with dashed-lines 21. The regions 18 and 22 may be appropriately-doped to ultimately become source/drain regions of vertical transistors, and the region 20 may be appropriately-doped to become a channel region of the vertical transistors. In some embodiments, the regions 18 and 22 may be p-type doped, and thus may become source/drain regions of PMOS transistors; and in some embodiments the regions 18 and 22 may be n-type doped, and thus may become source/drain regions of NMOS transistors. Although the regions 18, 20 and 22 are shown to be doped at the processing stage of FIGS. 1-1B, in other embodiments at least some of the doping within one or more of such regions may be provided at a subsequent processing stage. Also, it is to be understood that the semiconductor material 12 cold be junction-less metal oxide with semiconductor properties; such as IZO (indium zinc oxide), IGO (indium gallium oxide), ZnO (zinc oxide), IGZO (indium gallium zinc oxide), etc.

The conductive material 14 is ultimately incorporated into digit lines (i.e., sense lines, bitlines, etc.), and may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.) In some embodiments, the material 14 may comprise a stack containing one or more metals and/or metal-containing compositions (e.g., one or more of tungsten, tungsten silicide, titanium, titanium silicide, titanium nitride, etc.).

The insulative material 16 may comprise any suitable composition or combination of compositions. In some embodiments, the insulative material 16 may comprise, consist essentially of, or consist of silicon dioxide.

The insulative material 16 may be supported over a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

Figure 2A:
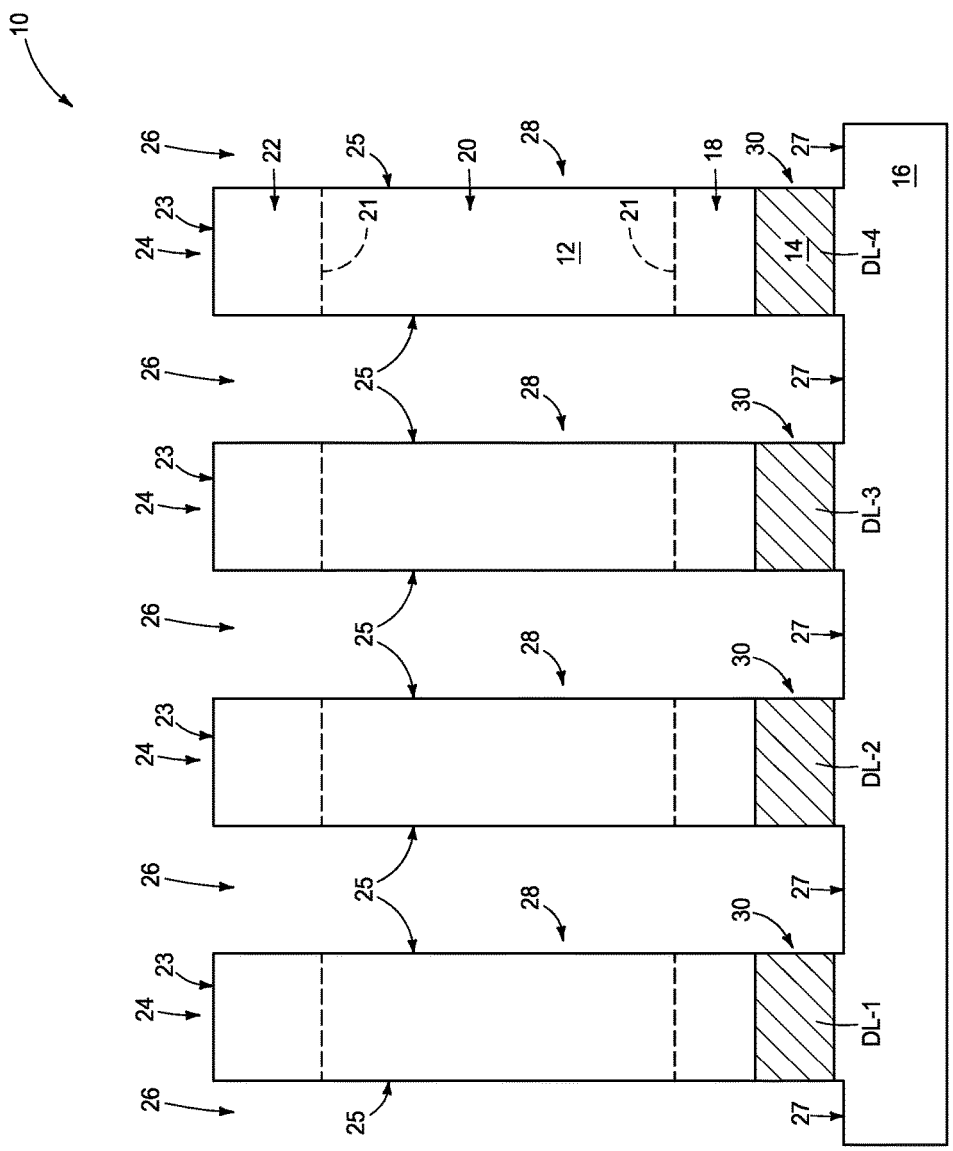
Figure 2B:
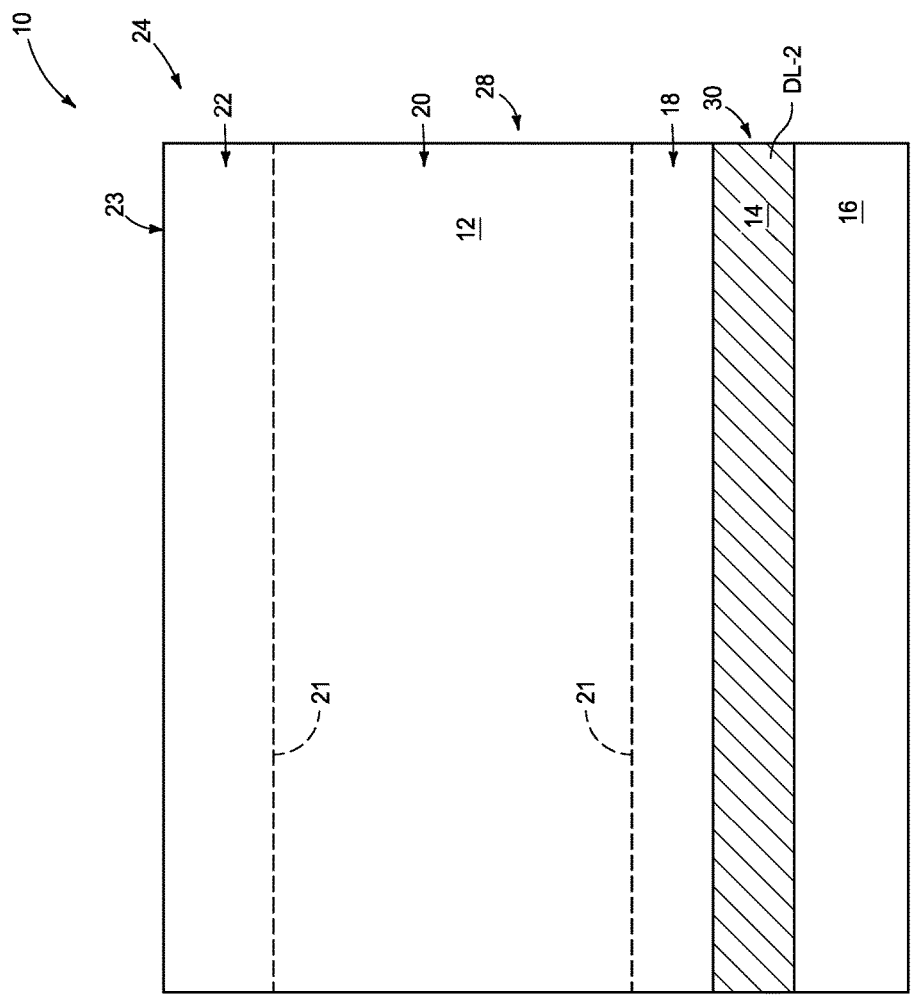

Referring to FIGS. 2-2B, the semiconductor material 12 and the digit-line material 14 are patterned into rails 24 which extend along a first direction represented by an axis 5 (shown relative to the top view of FIG. 2). The rails 24 are spaced from one another by gaps (i.e. trenches) 26. The rails may be substantially straight (i.e., straight to within reasonable tolerance of fabrication and measurement), wavy, etc.; but extend generally along the direction of axis 5.

In some embodiments, each of the rails 24 may be considered to comprise a first component (i.e., first portion) 28 corresponding to the semiconductor material 12 of the rail, and to comprise a second component (i.e., second portion) 30 corresponding to the digit-line material 14 of the rail. The digit-line rails correspond to digit lines DL-1, DL-2, DL-3 and DL-4 which extend in and out of the page relative to the cross-section sectional view of FIG. 2A.

The rails 24 may be formed with any suitable processing. For instance, a patterned mask (not shown) may be provided over semiconductor material 12 to define locations of the rails. Etching of materials 12 and 14 may be utilized to transfer a pattern from the mask into materials 12 and 14, and then the mask may be removed to leave the illustrated configuration of FIGS. 2-2B.

In the shown embodiment of FIGS. 2-2B, the gaps 26 extend into the insulative material 16. In other embodiments, the gaps may stop at an upper surface of the material 16.

The rails 24 have top surfaces 23 and sidewall surfaces 25. The sidewall surfaces 25 extend along the semiconductor material 12 and the digit-line material 14. In some embodiments, each of the rails 24 may be considered to have a pair of opposing sidewalls 25 along the cross-section of FIG. 2A.

The gaps 26 have bottom peripheries (also referred to herein as bottoms) 27 extending between sidewall surfaces 25 of the neighboring rails.

Figure 3A:
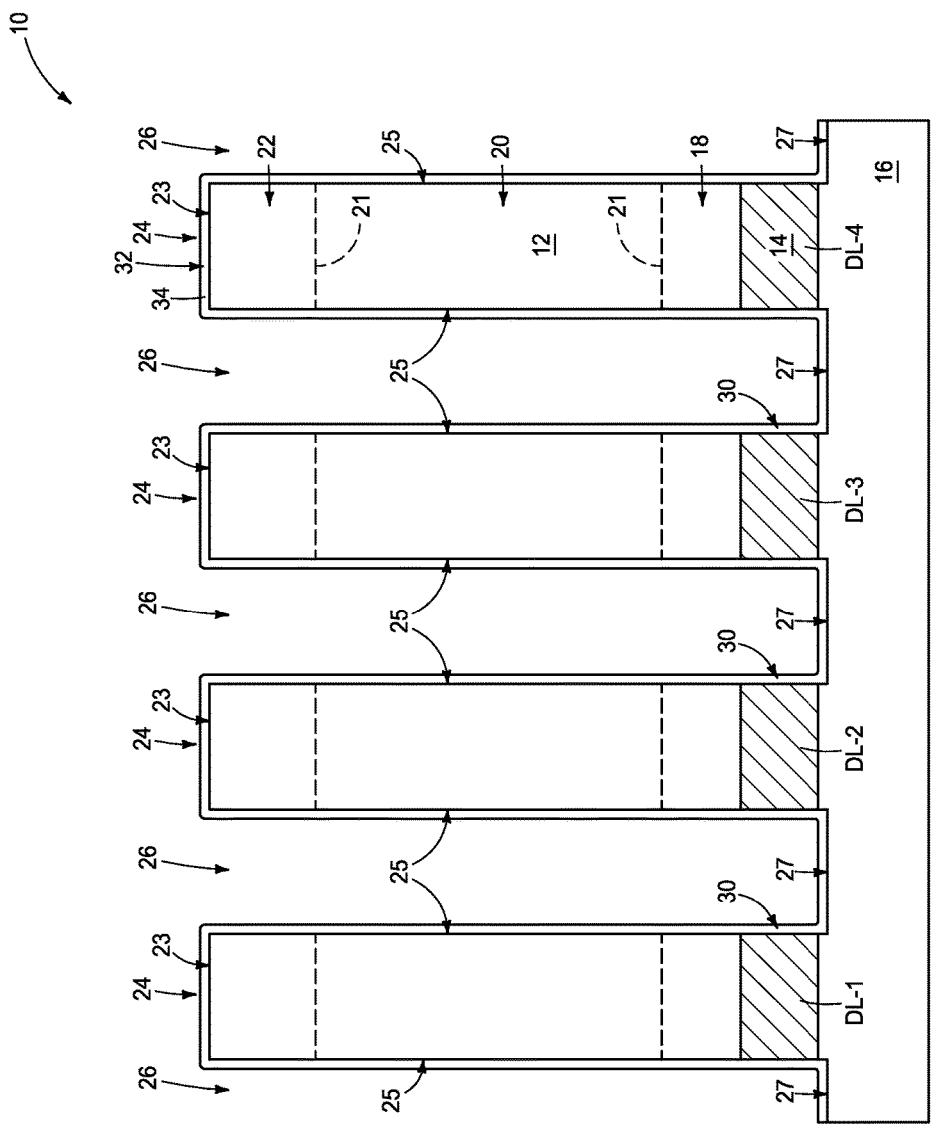
Figure 3B:
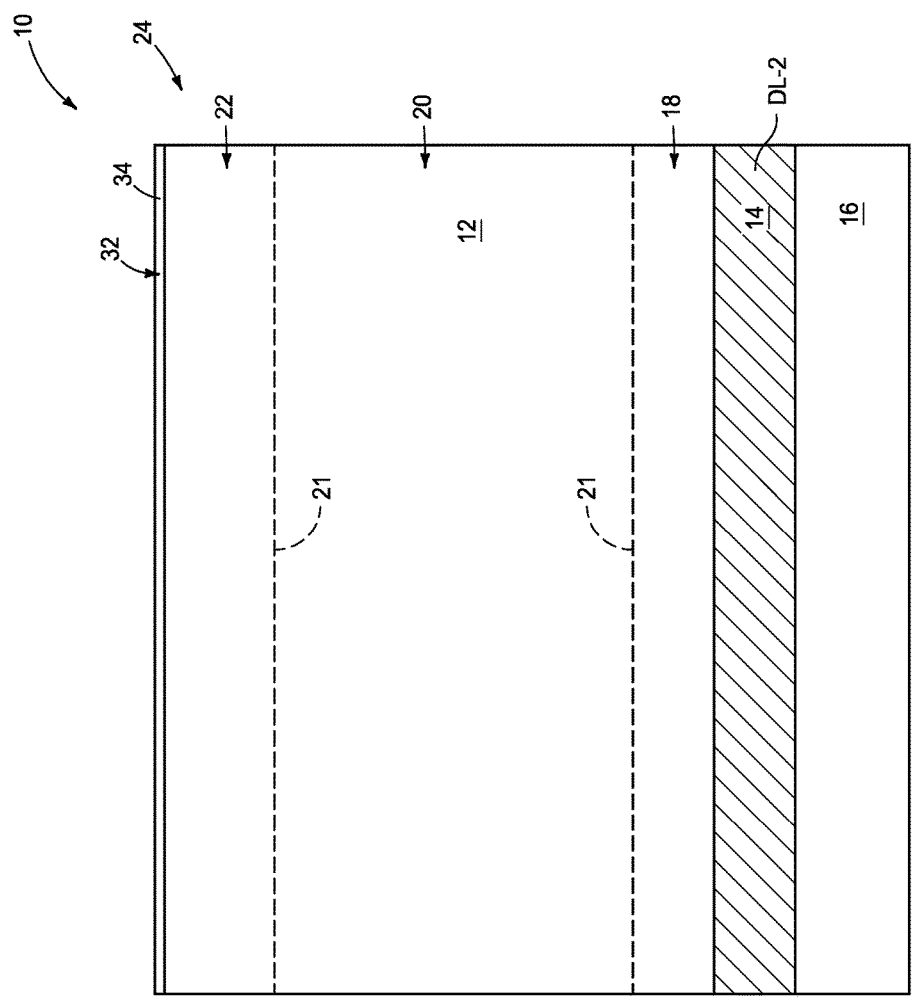

Referring to FIGS. 3-3B, a layer 32 of carbon-doped oxide 34 is formed along the rails 24. The layer 32 extends along and directly against the top surfaces 23 and the sidewall surfaces 25 of each of the rails, and also extends along the bottoms 27 of the gaps 26.

In the shown embodiment, the carbon-doped oxide 34 is along and directly against the various transistor regions 18, 20 and 22 provided within the semiconductor material 12.

In some embodiments, the digit-line material 14 includes metal-containing regions, and the sidewalls 25 of the rails 24 have metal-containing segments along such metal-containing regions. The carbon-doped oxide is directly against the metal-containing segments of the sidewalls 25 along the digit-line material 14.

The carbon-doped oxide may comprise any suitable insulative composition(s); including carbon-doped silicon dioxide, carbon-doped germanium oxide, etc. In some embodiments, the carbon-doped oxide may comprise, consist essentially of, or consist of carbon-doped silicon dioxide. The carbon-doped oxide 34 may be referred to as carbon-doped silicon dioxide throughout the remainder of the description provided herein, as carbon-doped silicon dioxide is presently considered to be of particular interest; but it is to be understood that other carbon-doped oxides may be utilized in some applications.

The carbon concentration within the carbon-doped silicon dioxide may be at least about 3%, by volume; and in some embodiments may be within a range of from about 3% to about 20%, by volume.

The carbon-doped silicon dioxide may be formed with any suitable processing. The carbon doping may be provided with an implant and/or in situ during deposition of the material 34. In some example embodiments, the carbon-doped silicon dioxide may be formed by chemical vapor deposition utilizing precursors which include tetramethylcyclotetrasiloxane, $O_2$ and a source of carbon (e.g., methane, carbon monoxide, carbon dioxide, etc.). In some embodiments, the deposition may be conducted at a temperature at or below about 500° C. Such low-temperature processing may be advantageous in that such may avoid detrimental thermal damage to structures associated with construction 10.

The layer 32 of carbon-doped silicon dioxide may be quite thin and still remain continuous. In some embodiments, the layer 32 may have a thickness within a range of from about 10 Å to about 30 Å.

Figure 4A:
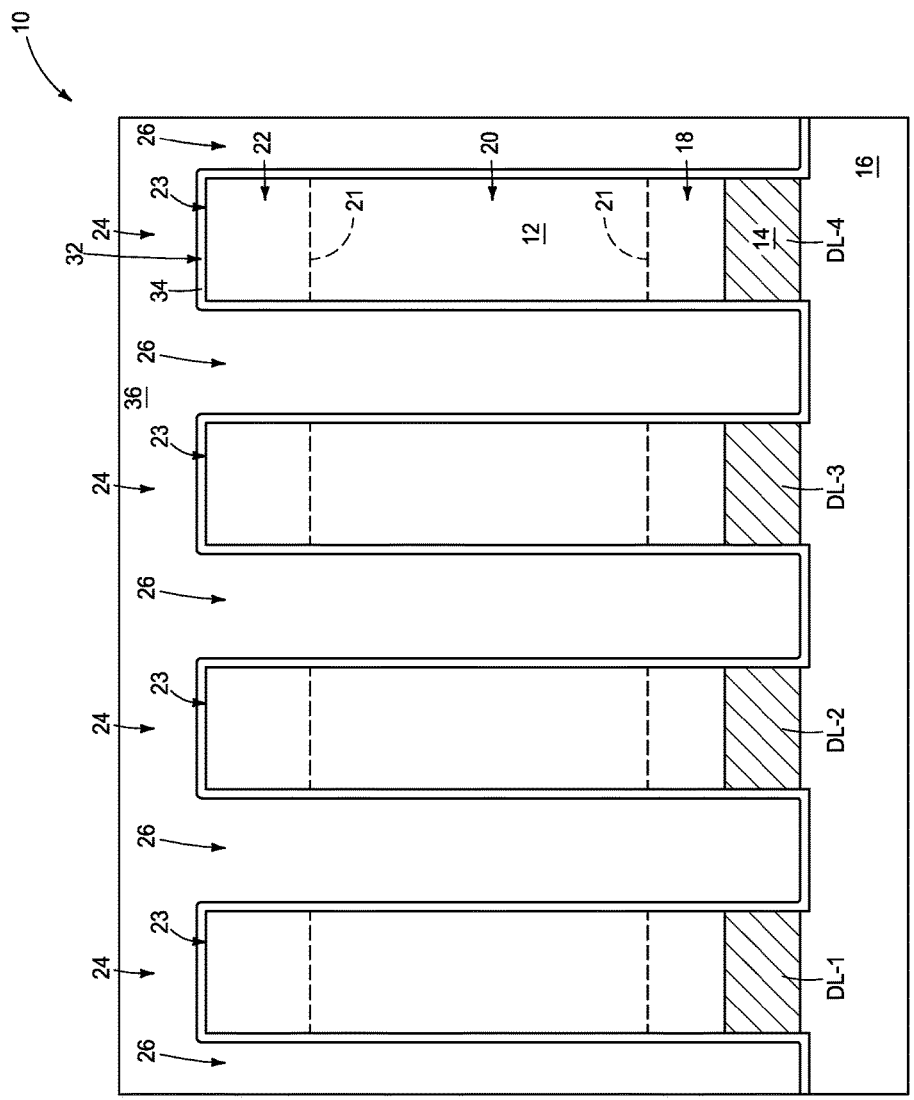
Figure 4B:
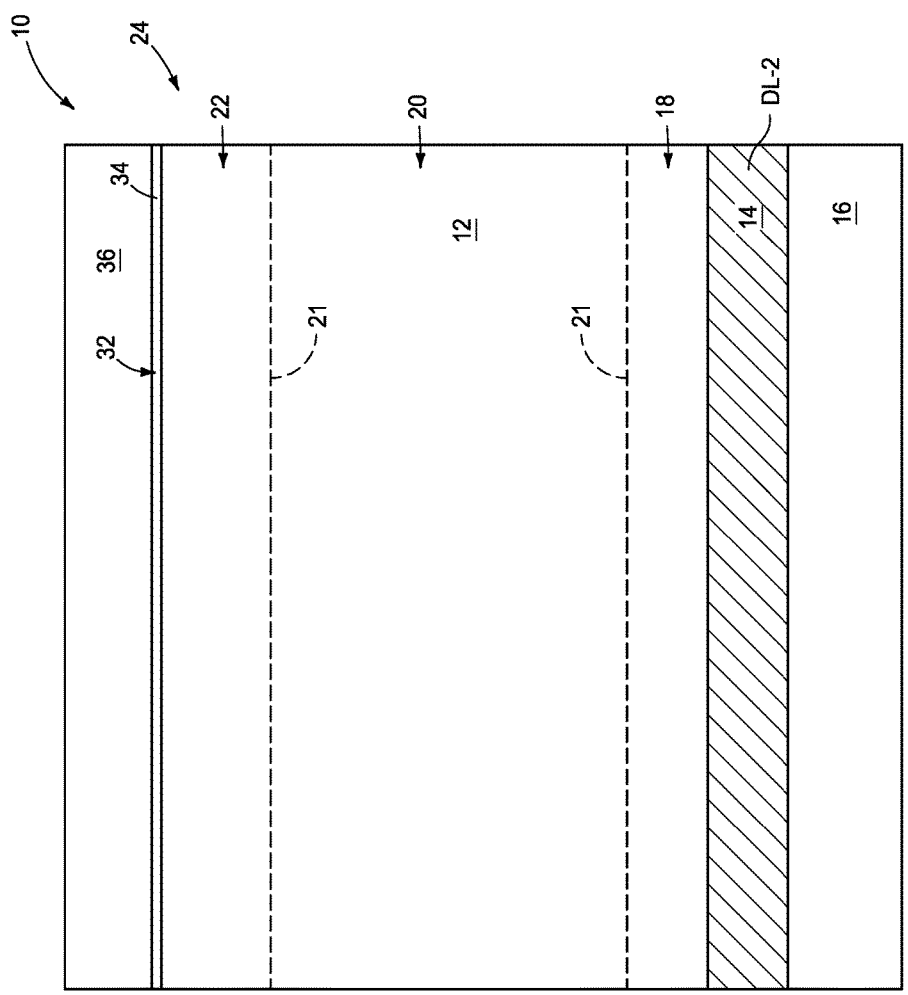

The layer 32 of carbon-doped silicon dioxide 34 narrows the gaps 26. Such narrowed gaps may be filled with insulative material has shown in FIGS. 4-4B. Specifically, FIGS. 4-4B show insulative material 36 formed within the narrowed gaps 26 and over the rails 24. In the shown embodiment, the insulative material 36 is directly against the carbon-doped silicon dioxide 34.

The insulative material 36 may comprise any suitable composition(s); and in some embodiments may comprise, consist essentially of, or consist of silicon dioxide. Notably, the carbon-doped silicon oxide 34 may form an effective barrier to prevent diffusion of oxygen from the silicon dioxide of insulative material 36 into materials of rails 24 (e.g., to prevent diffusion of oxygen into metal of the digit lines). The carbon-doped silicon oxide may be advantageous relative to the silicon nitride of conventional structures (described above in the Background section). Specifically, the carbon-doped silicon dioxide is not a trapping material, and accordingly problematic trapping behavior of silicon nitride is avoided by utilizing the carbon-doped silicon oxide instead of silicon nitride. Further, the carbon-doped silicon dioxide may be formed thinner than silicon nitride while remaining a continuous layer suitable for precluding undesired oxygen migration. Additionally, the pad oxide conventionally utilized as a protective material between nitride and semiconductor surfaces (described above in the Background section) may be eliminated; saving space, and also reducing processing steps and associated costs. The replacement of silicon nitride and pad oxide of conventional structures with the carbon-doped silicon dioxide 34 may enable higher levels of integration to be achieved with architectures described herein as compared to conventional architectures for at least the reasons that the carbon-doped silicon dioxide may be formed thinner than silicon nitride while maintaining suitable barrier properties, and that the pad oxide may be eliminated. Another advantage of the carbon-doped silicon dioxide is that such may have a dielectric constant (k) less than that of silicon dioxide (i.e., may be a low-k material). Accordingly, capacitive coupling between adjacent conductive structures may be advantageously reduced utilizing carbon-doped silicon dioxide as compared to other materials having higher dielectric constants than the carbon-doped silicon dioxide.

Figure 5:
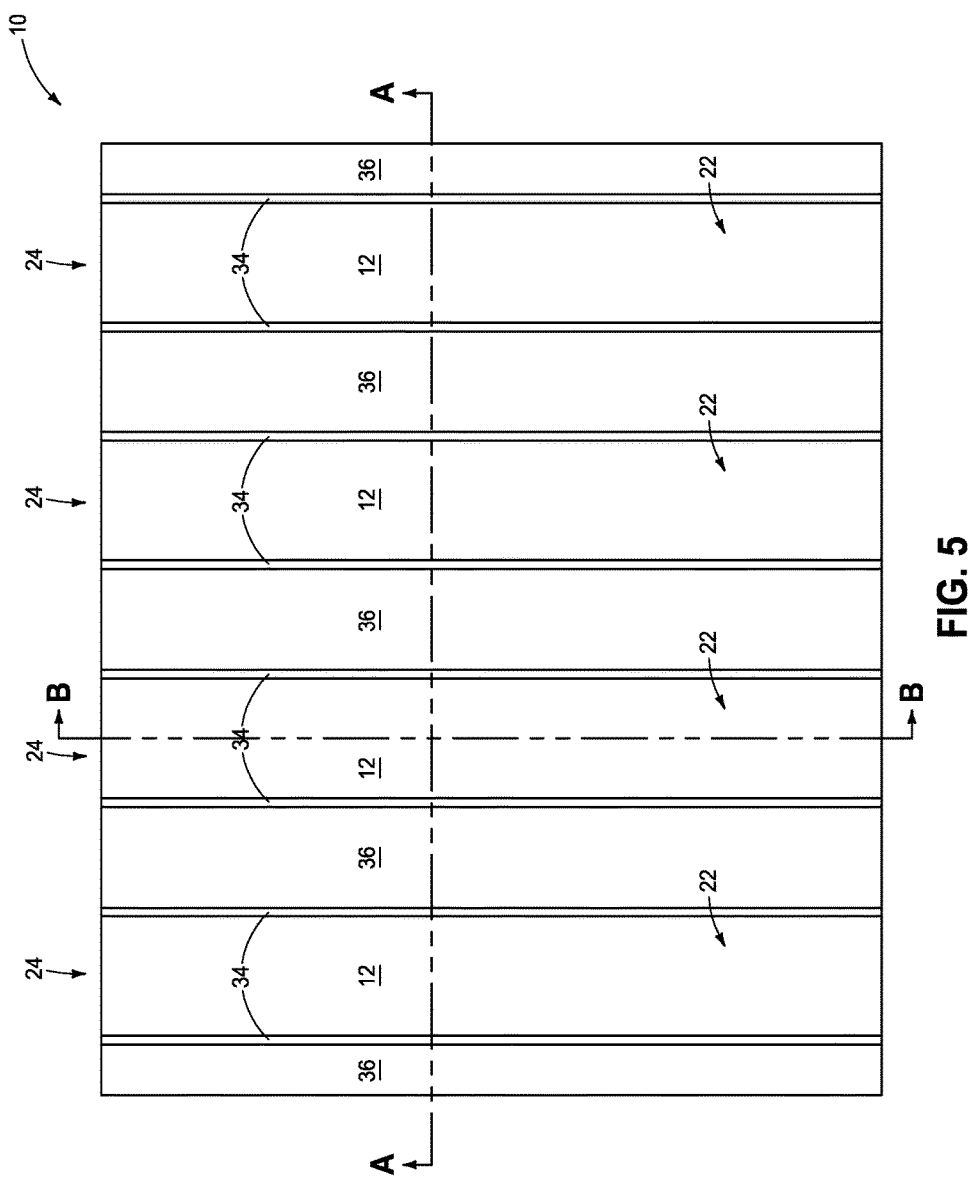
Figure 5A:
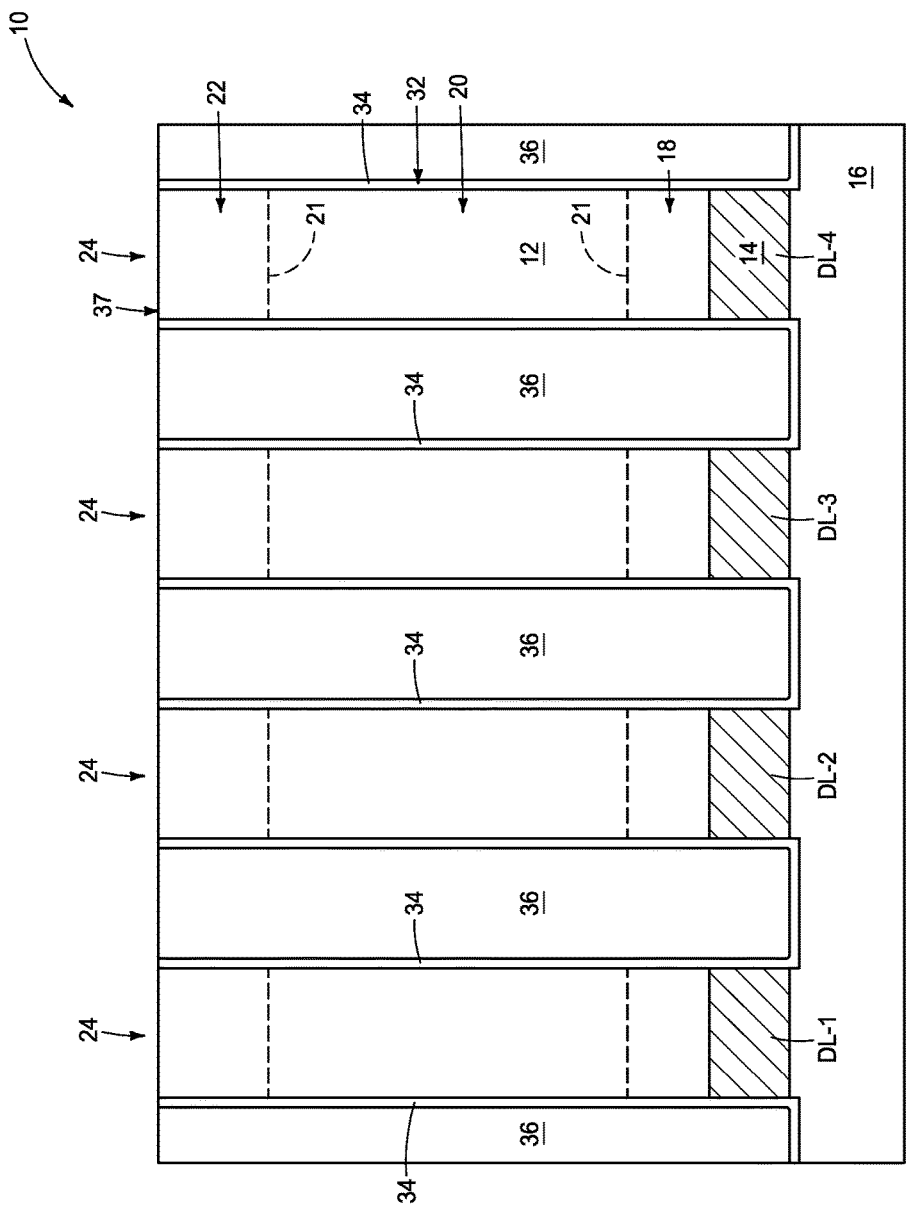
Figure 5B:
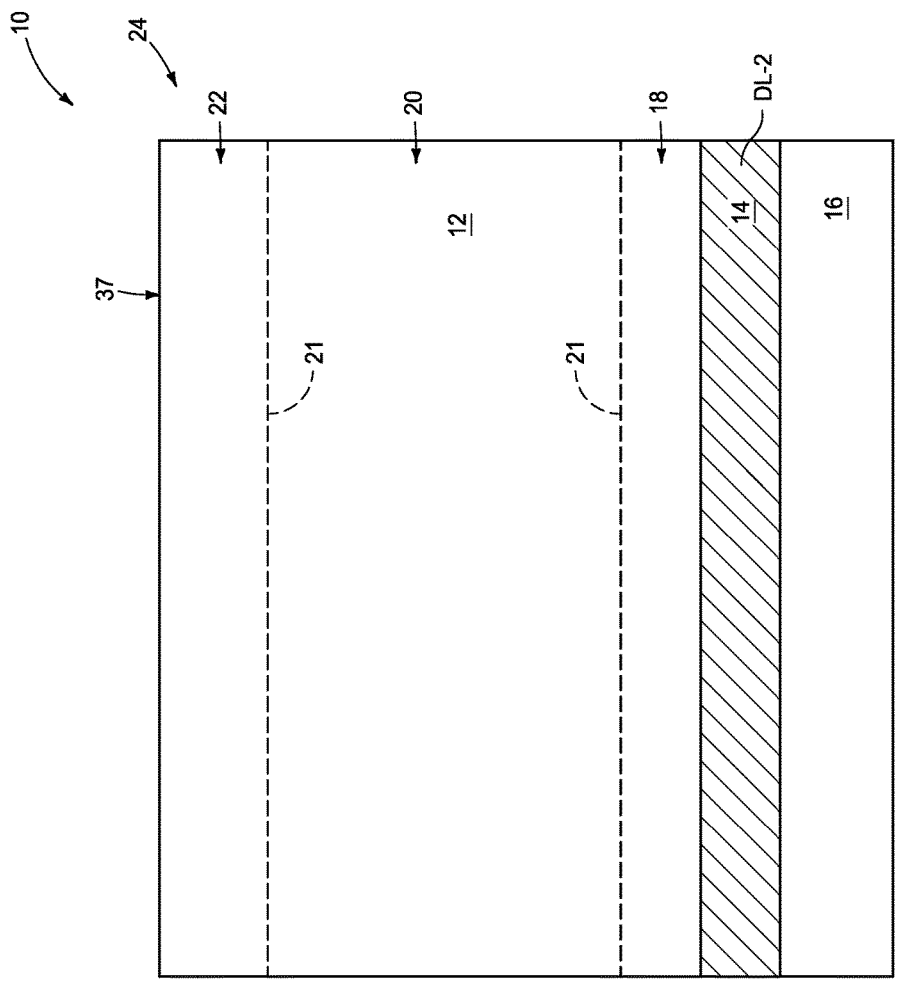

Referring to FIGS. 5-5B, a planarized surface 37 is formed across the semiconductor material 12, the carbon-doped silicon dioxide 34, and the insulative material 36. The planarized surface 37 may be formed with any suitable processing; including, for example, chemical-mechanical polishing (CMP). In some embodiments, the processing of FIGS. 5-5B may be omitted.

Figure 6:
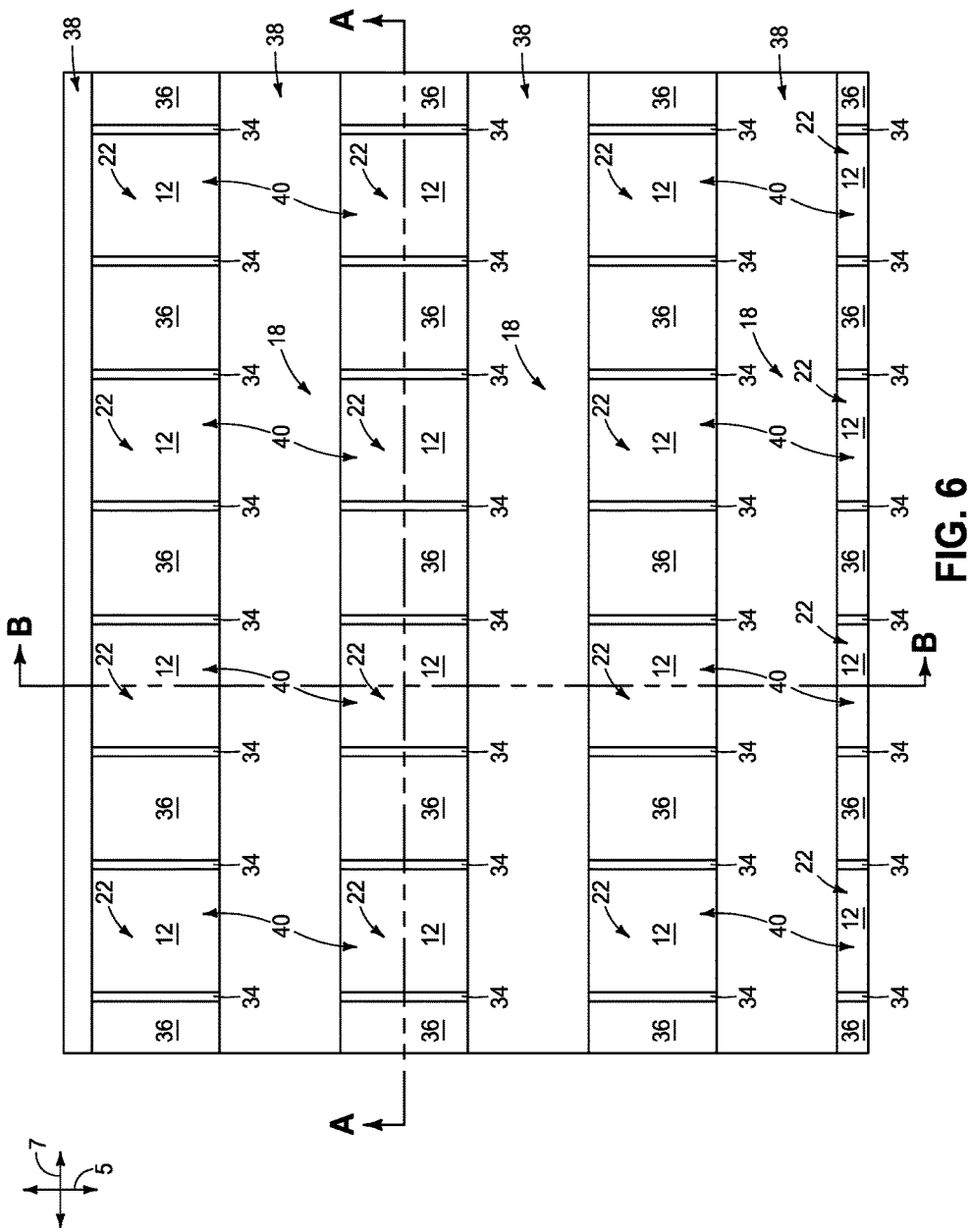
Figure 6A:
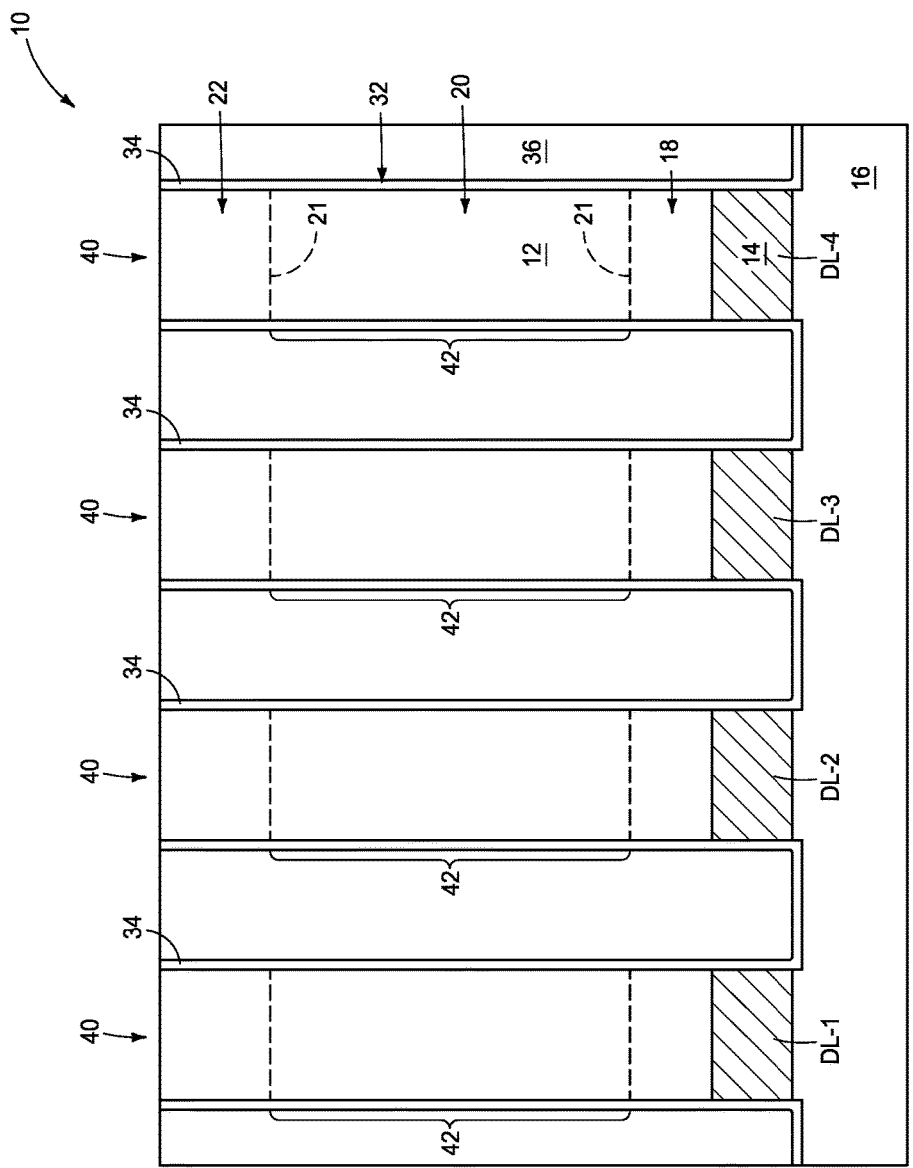
Figure 6B:
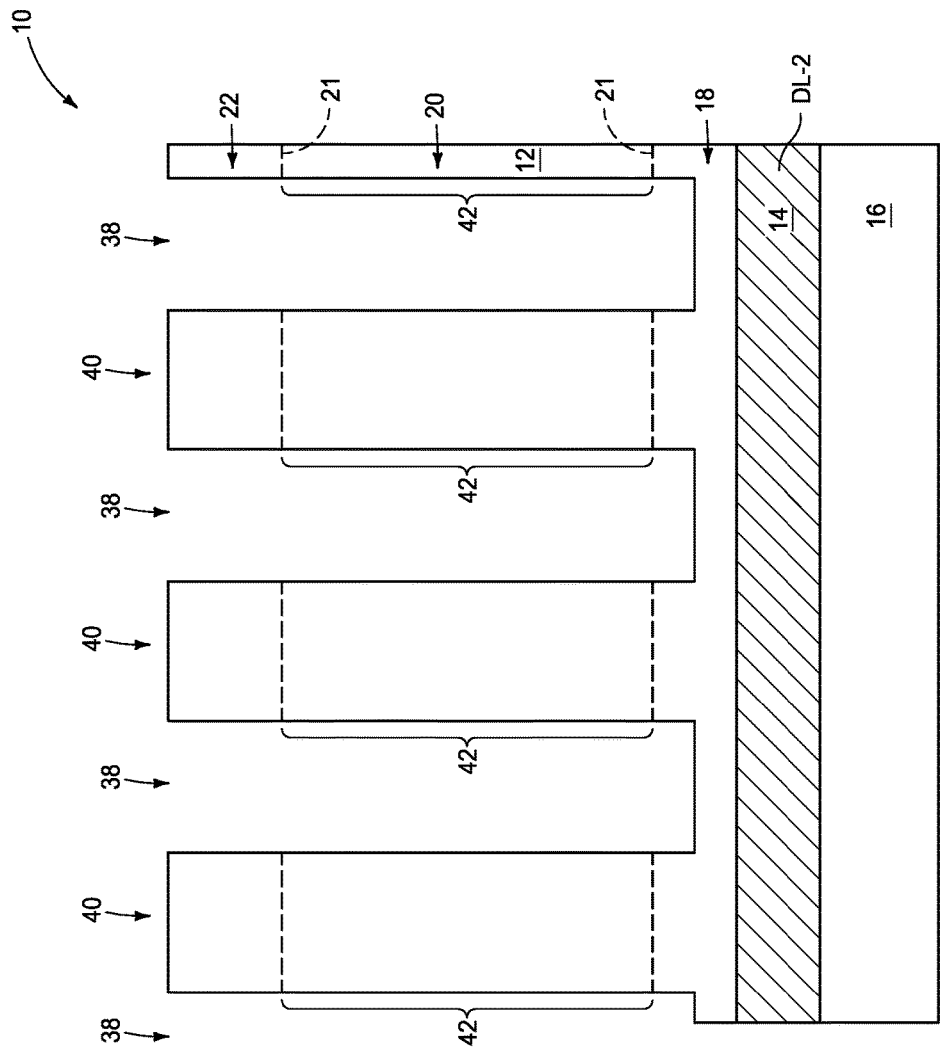

Referring to FIGS. 6-6B, trenches 38 are formed within semiconductor material 12. The trenches 38 extend along a second direction represented by an axis 7 (shown relative to the top view of FIG. 6). The second direction of axis 7 crosses the first direction of axis 5. In the shown embodiment, the second direction of the axis 7 is substantially orthogonal to the first direction of the axis 5 (with the "substantially orthogonal" meaning orthogonal to within reasonable tolerances of fabrication and measurement). The trenches may be substantially straight (i.e., straight to within reasonable tolerance of fabrication and measurement), wavy, etc.; but extend generally along the direction of axis 7.

The trenches 38 extend partially through the bottom source/drain region 18 within the semiconductor material 12. The trenches 38 may be considered to slice the semiconductor material 12 of rails 24 (FIGS. 5-5B) into pillars 40. Each of the pillars 40 has a vertically-extending transistor channel region 42 (shown in FIGS. 6A and 6B, with the transistor channel regions 42 corresponding to the regions 20 between the source/drain-doped regions 18 and 22).

Figure 7:
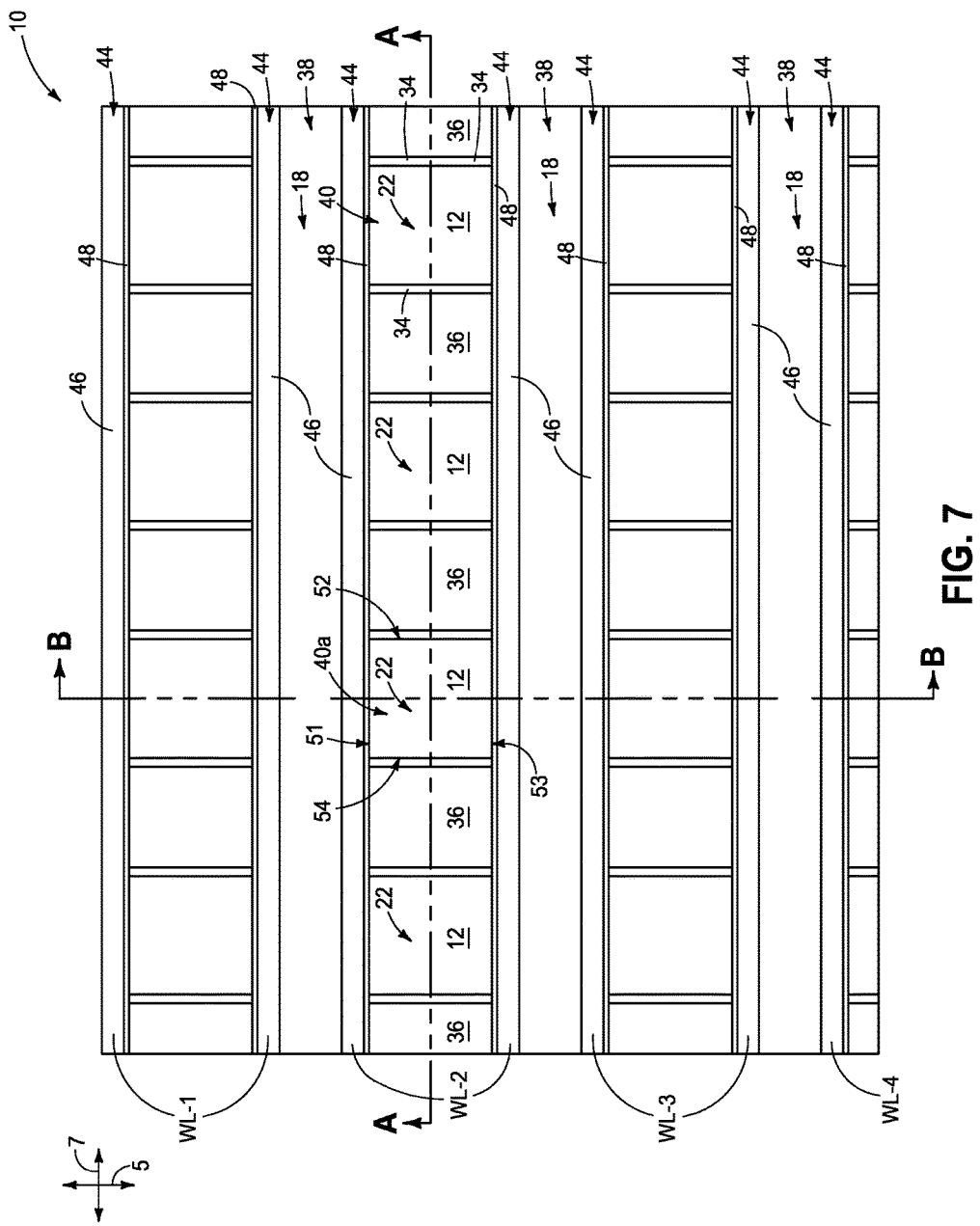
Figure 7A:
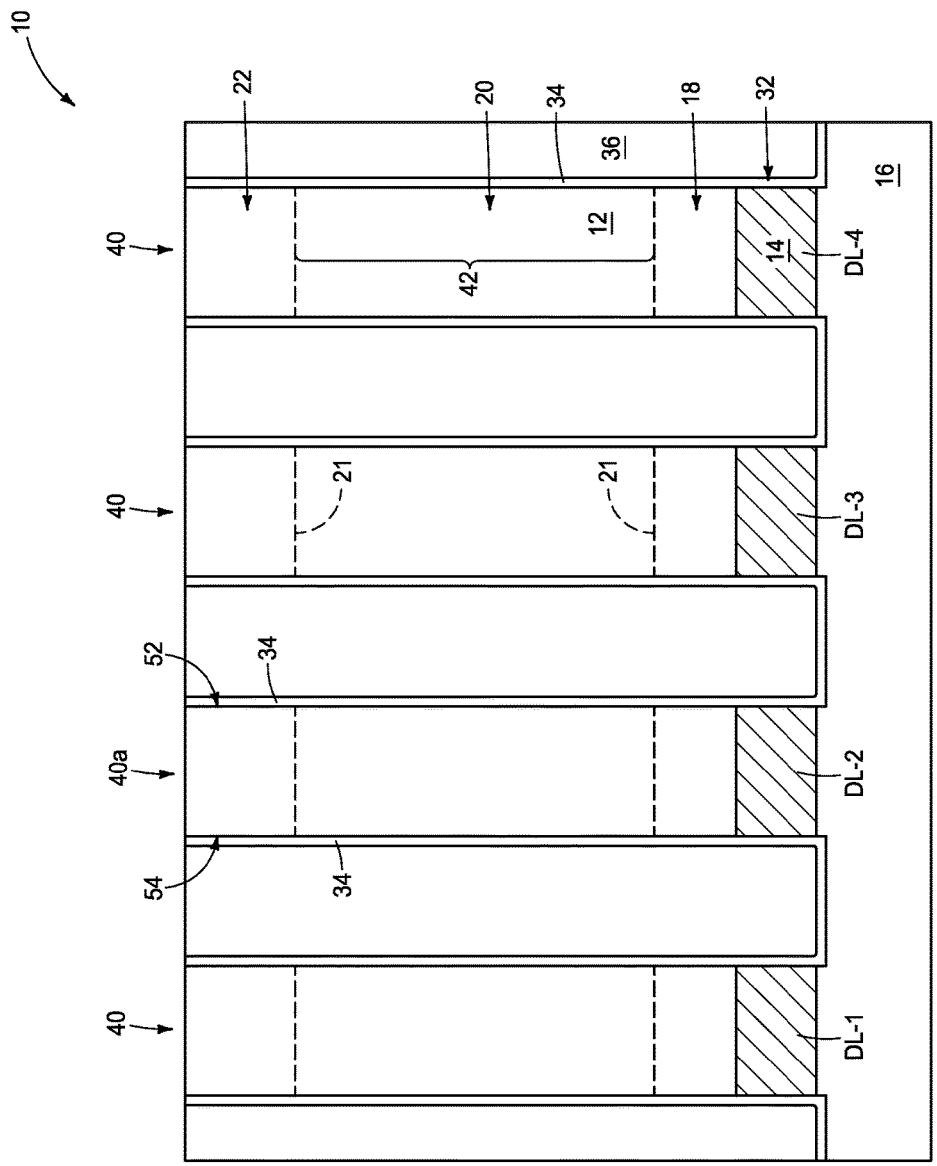
Figure 7B:
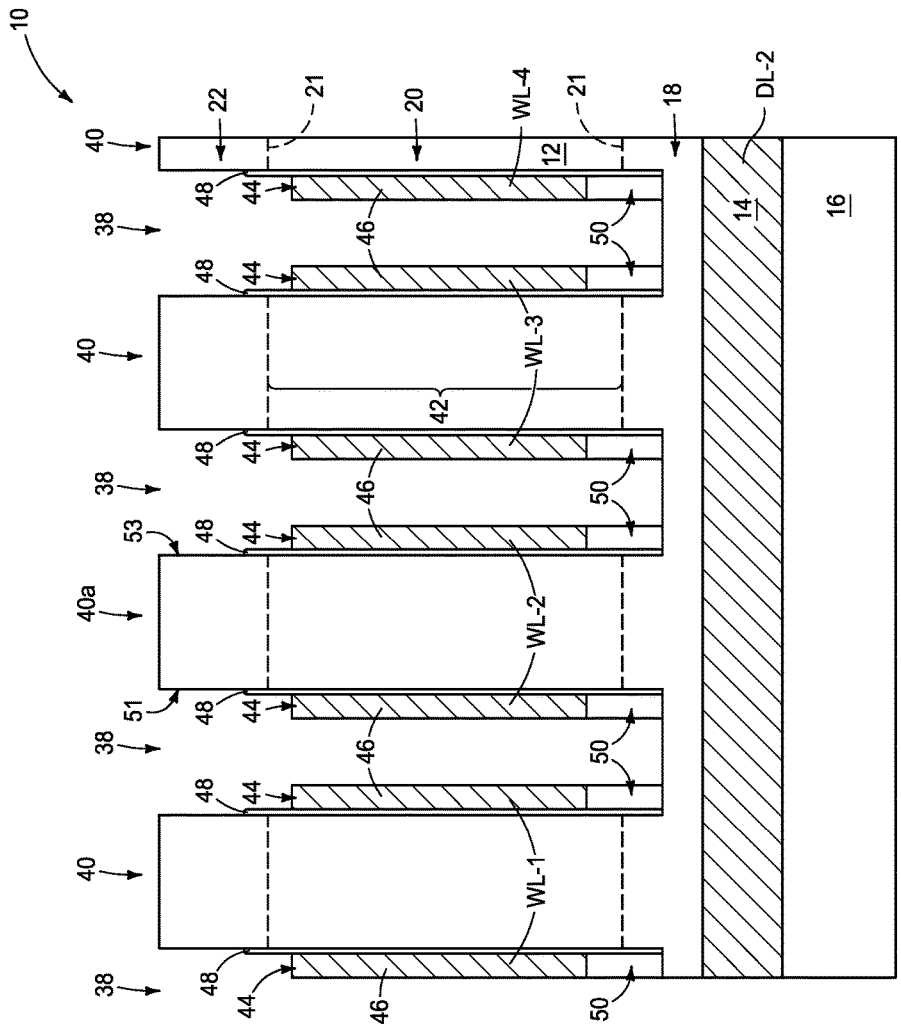

Referring to FIGS. 7-7B, wordlines 44 are formed within the trenches 38. The wordlines 44 comprise conductive material 46. The conductive material 46 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The wordlines extend along the semiconductor material pillars 40, and are spaced from such pillars by insulative material 48. The insulative material 48 may comprise any suitable composition or combination of compositions; and in some embodiments may comprise, consist essentially of, or consist of silicon dioxide. The insulative material 48 may be referred to as gate dielectric material.

In operation, portions of the wordlines 44 along the transistor channel regions 42 gate such channel regions; and thereby gatedly couple the lower source/drain regions 18 with the upper source/drain regions 22 within each of the pillars 40. The wordlines 44 have portions on each of the opposing sides of the illustrated pillars 40, and such portions are together operated as a single wordline. Accordingly, the wordlines 44 on opposing sides of each of the pillars 40 are shown being paired together and operated as four wordlines WL-1, WL-2, WL-3 and WL-4. The paired portions of each of the wordlines will WL-1, WL-2, WL-3 and WL-4 are electrically coupled to one another in a location outside of the illustrated region of construction 10.

In the illustrated embodiment, the wordlines 44 are supported by insulative steps 50 (shown in FIG. 7B). Such insulative steps are utilized to support the wordlines 44 in desired locations relative to the channel regions 42 within the semiconductor material pillars 40. The insulative steps 50 may comprise any suitable insulative composition(s); and in some embodiments may comprise, consist essentially of, or consist of silicon oxide.

The gate dielectric material 48, wordlines 44 and insulative steps 50 may be formed utilizing any suitable processing. For instance, the structures 48, 44 and 50 of FIGS. 7-7B may be formed by providing layers of appropriate materials conformally along the pillars 40 and across the gaps between the pillars, and then utilizing anisotropic etching to convert such layers into the desired structures. FIGS. 7-7B illustrate example configurations for the structures 48, 44 and 50, and other configurations may be utilized in other embodiments. For instance, in some embodiments the insulative steps 50 may extend entirely across the bottoms of the trenches 38, rather than being etched into structures coextensive with the wordlines 44. Also, in some embodiments the gate dielectric material 48 and the steps 50 may comprise a common composition as one another, and accordingly may merge as a single composition rather than being the separate compositions illustrated in FIG. 7B.

The wordlines 46 extend generally along the second direction represented by the axis 7, and are adjacent the vertically-extending transistor channel regions 42 within the pillars 40. One of the pillars is labeled as 40a, and is utilized as an example pillar to describe features of the pillars. The pillar 40a is substantially identical to all of the other pillars 40, and the label 40a is utilized to simplify discussion of the features associated with the pillars rather than to indicate any differences between the pillar 40a and other pillars.

The pillar 40a has four sidewalls 51-54. The sidewalls 51 and 53 are in opposing relation to one another, and likewise the sidewalls 52 and 54 are in opposing relation to one another. The sidewalls 51 and 53 are adjacent to the wordlines 44, and accordingly may be considered to be gated sidewalls. The sidewalls 52 and 54 are not adjacent to wordlines, and accordingly may be considered to be non-gated sidewalls. The carbon-doped silicon dioxide 34 is directly against the non-gated sidewalls 52 and 54.

Figure 8:
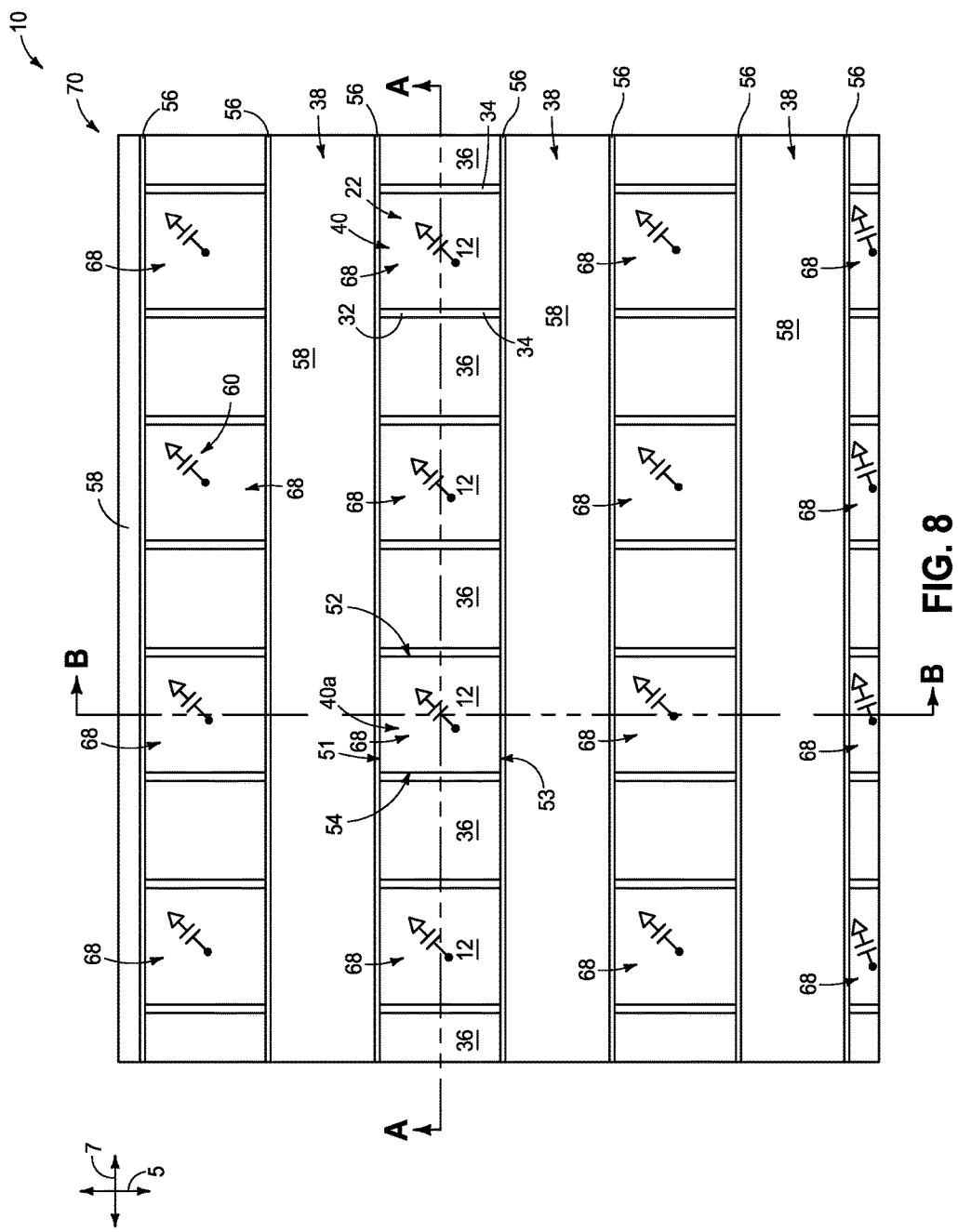
Figure 8A:
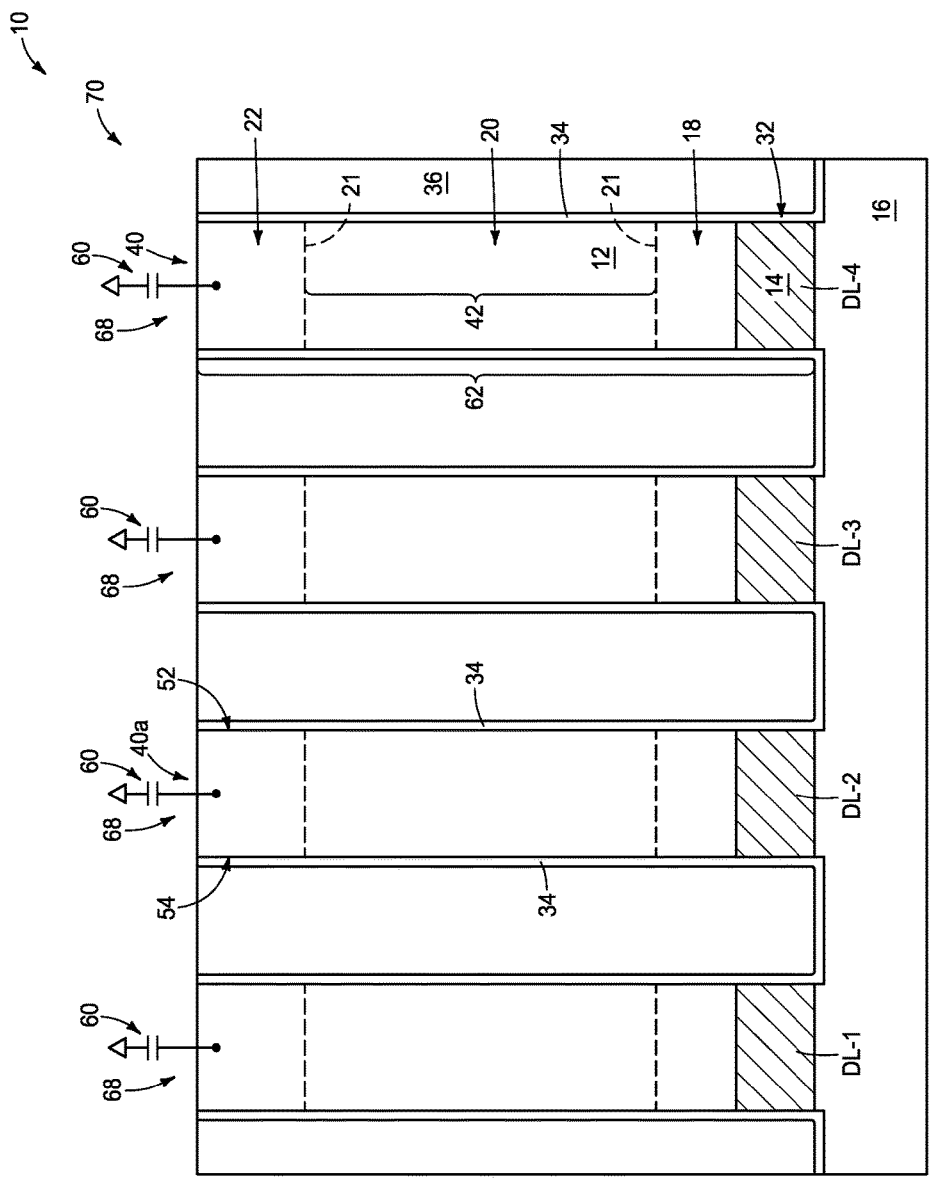
Figure 8B:
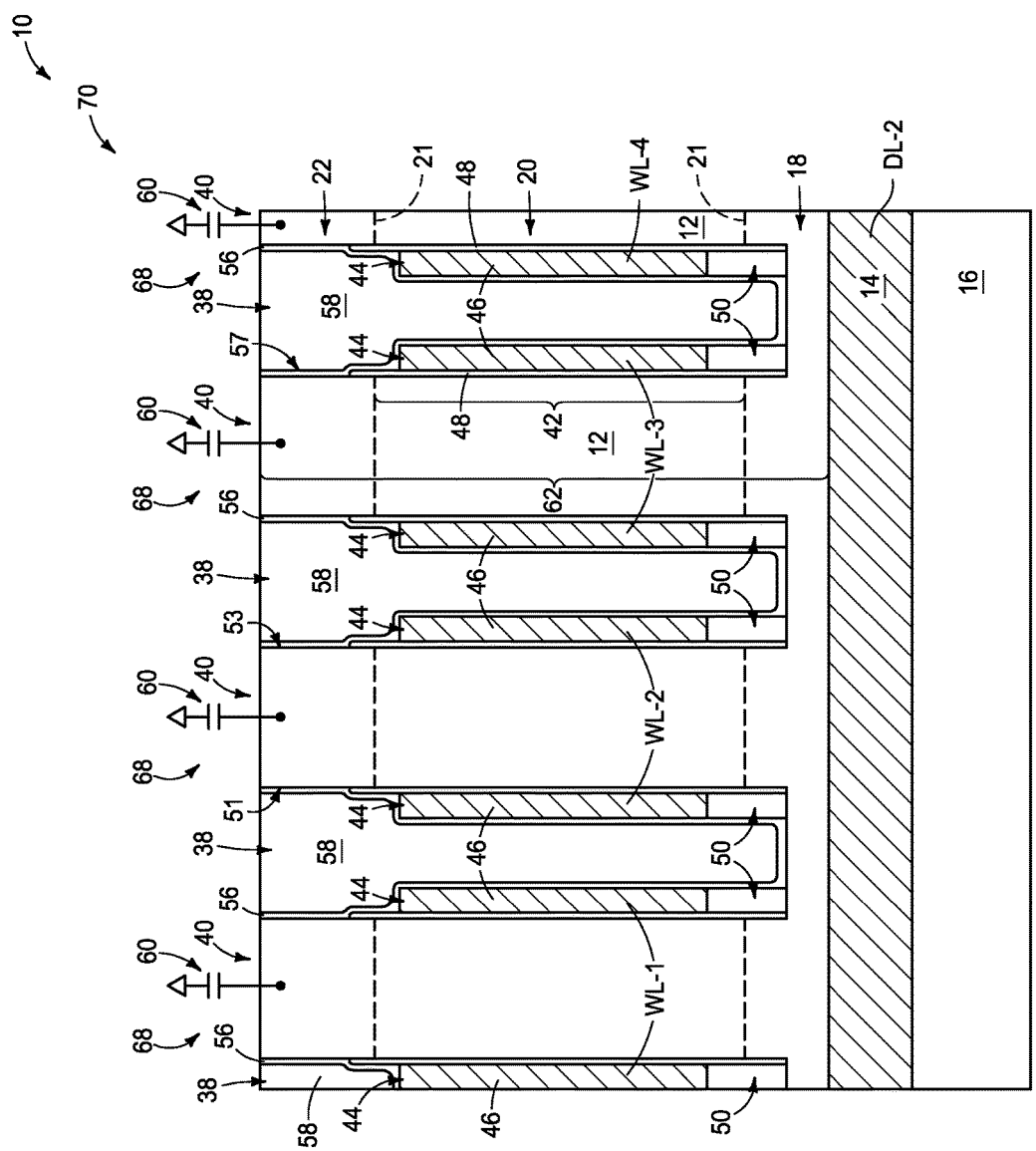

Referring to FIGS. 8-8B, carbon-doped oxide 56 is formed to line the trenches 38. The carbon-doped oxide 56 may comprise a same composition as the carbon-doped oxide 34, or may comprise a different composition relative to the carbon-doped oxide 34. In some embodiments, both the carbon-doped oxide 56 and the carbon-doped oxide 34 comprise, consist essentially of, or consist of carbon-doped silicon dioxide. The carbon-doped oxide 56 may be formed utilizing the same conditions described above relative to the carbon-doped oxide 34. In some embodiments, the carbon-doped oxide 34 may be considered to form a first layer 32 of carbon-doped oxide, and the carbon-doped oxide 56 may be considered to form a second layer 57 of carbon-doped oxide.

In the shown embodiment, the carbon-doped oxide 56 is over and directly against the wordlines 44. Such may be advantageous in some embodiments in that the carbon-doped oxide may form a protective barrier over the wordlines.

Insulative fill material 58 is deposited within the trenches 38 and along the carbon-doped oxide 56. The insulative fill material 58 may comprise any suitable composition(s); and in some embodiments may comprise, consist essentially of, or consist of silicon dioxide. The silicon dioxide may be formed as a spin-on dielectric (SOD). A problem encountered with SOD is that oxygen may diffuse during deposition of the SOD, and/or during subsequent annealing of the SOD (e.g., densification with steam and/or $H_2O_2$). Regardless, the carbon-doped oxides 34 and 56 may be effective barriers to block the diffusing oxygen from reaching metal-containing material 14 of the digit lines (DL-1, DL-2, DL-3 and DL-4), metal-containing material of the wordlines (WL-1, WL-2, WL-3 and WL-4), and/or other structures which may be damaged or otherwise adversely affected by the diffusing oxygen. Further, the carbon-doped oxides may be thermally stable, and may be compatible with oxide/nitride dry etching.

Each of the pillars 40 comprises an upper source/drain region 22, a lower source/drain region 18, and a vertically-extending channel 42 between the upper and lower source/drain regions. In some embodiments, one of the source/drain regions 22 and 24 may be referred to as a first source/drain region, and the other of the source/drain regions 22 and 24 may be referred to as a second source/drain region.

In some embodiments, the pillars 40 may be considered to be examples of semiconductor material structures which comprise channel regions 42. In the shown embodiment, such channel regions extend vertically. In other embodiments, the channel regions may have other configurations. The carbon-doped materials 34 and 56 are directly against sidewall portions of the semiconductor material structures 40. In the shown embodiment, the carbon-doped oxide 34 is along and against the entireties of sidewalls 52 and 54 of the semiconductor material structures (illustrated relative to an example structure 40a in FIG. 8A), and is along sidewalls of the digit lines (e.g., DL-1). Accordingly, the carbon-doped oxide 34 is along segments of the sidewalls 52 and 54 which include surfaces of the first and second source/drain regions 18 and 22, which include surfaces of the channel regions 42, and which include surfaces of the digit lines (e.g., DL-1). In other embodiments, the carbon-doped oxide 34 may be along only portions of the sidewalls 52 and 54 (e.g., may not be along one or both of the source/drain regions 18/22, may not be along the channel region 42, etc.).

In the shown embodiment, the carbon-doped oxide 56 is directly against portions of the gated sidewalls 51 and 53 of the semiconductor material structures 40. In the shown embodiment, the carbon-doped oxide 56 is only along a surface of the upper source/drain region 22, and is not along surfaces of the lower source/drain region 18 or the channel region 42.

In some embodiments, the carbon-doped oxide 56 may be omitted. In some embodiments, silicon nitride may be formed within the trenches 38 in addition to carbon-doped oxide 56. In some embodiments, pad oxide/silicon nitride may be utilized instead of the carbon-doped oxide 56/insulative fill material 58.

Capacitors 60 are diagrammatically illustrated as being electrically coupled with the upper source/drain regions 22. The lower source/drain regions 18 are electrically coupled with the digit lines DL-1, DL-2, DL-3 and DL-4. The regions 18, 20 and 22 within each pillar are incorporated into transistors 62, with such transistors having gates corresponding to regions of the wordlines 44 along the vertically-extending channel regions 42. The capacitors 60, together with the transistors 62, are incorporated into memory cells 68. Each memory cell has an access transistor 62 comprising doped regions 18, 20 and 22 within a semiconductor pillar 40, and comprises a charge-storage device corresponding to the capacitor 60. In other embodiments, other suitable charge-storage devices may be utilized. In operation, the wordlines WL-1, WL-2, WL-3 and WL-4 may be utilized to gatedly couple the digit lines to the capacitors during read/write operation of the memory cells 68.

Figure 9:
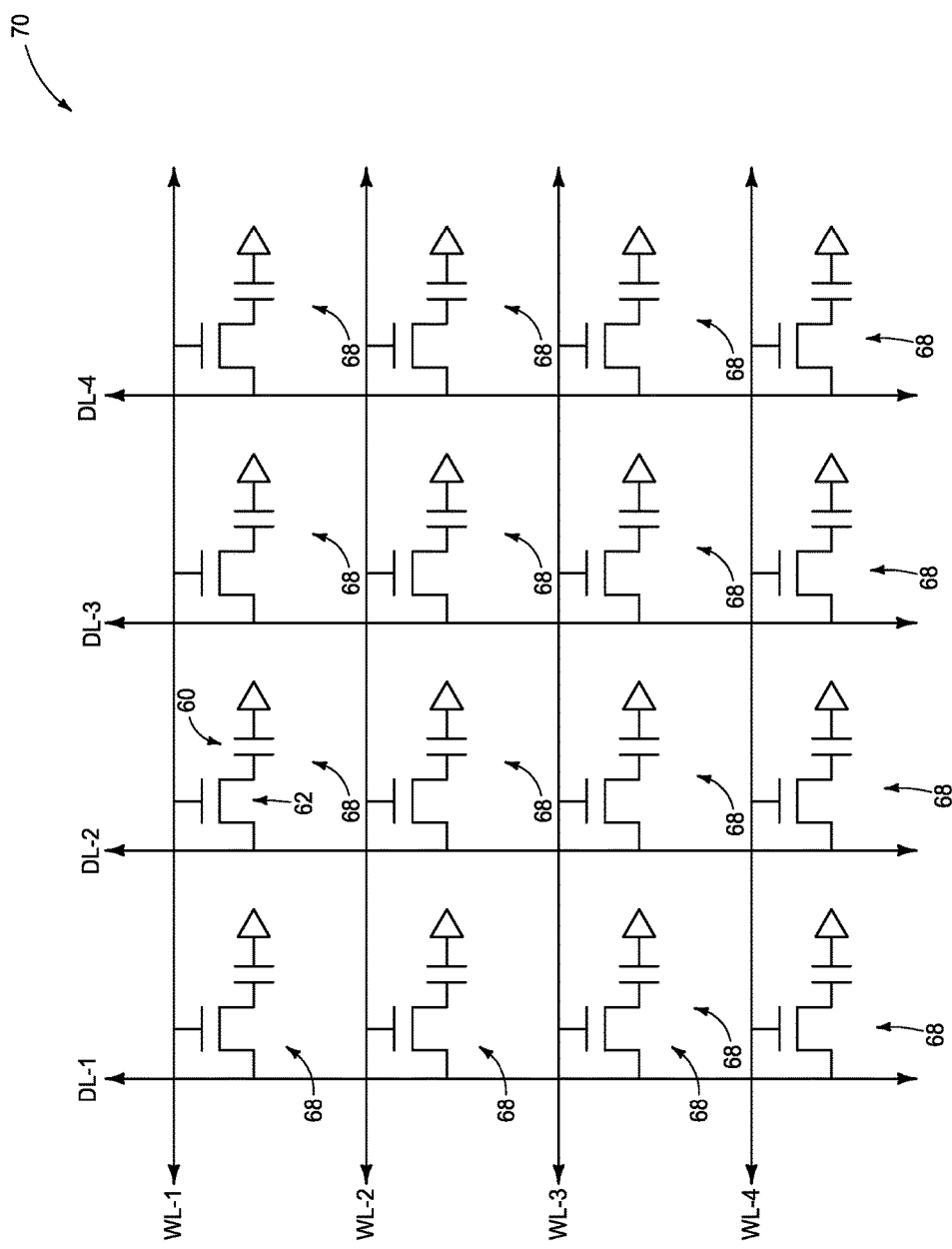
FIG. 9 is a schematic view of an example memory array.

The memory cells 68 may be considered to form an integrated memory array (i.e., integrated memory assembly) 70. An example memory array 70 is schematically illustrated in FIG. 9. The memory array comprises a plurality of the memory cells 68, with each memory cell being uniquely addressed through the combination of one of the digit lines (DL-1, DL-2, DL-3 and DL-4) and one of the wordlines (WL-1, WL-2, WL-3 and WL-4). The illustrated region of the memory array comprises 16 memory cells 68, but it is to be understood that the memory array may comprise any suitable number of memory cells; including, for example, hundreds, thousands, millions, etc. of substantially identical memory cells (with the term "substantially identical" meaning identical to within reasonable tolerances of fabrication and measurement). The illustrated memory cells comprise one transistor in combination with one capacitor (i.e., are 1T-1C memory cells). In other embodiments, other memory cells may be fabricated with methodology analogous to that described herein.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having semiconductor material structures which each have a transistor channel region, and which are over metal-containing structures. Carbon-doped oxide is adjacent and directly against at least a portion of each of the semiconductor material structures, and is along sidewalls of the metal-containing structures. The carbon-doped oxide has a carbon concentration of at least about 3%, by volume.

Some embodiments include an integrated assembly having pillars of semiconductor material. Each of the pillars has a transistor channel region. Each of the pillars has four sidewalls. Two of the four sidewalls of each pillar are gated sidewalls which are in opposing relation to one another and which are adjacent to wordlines. The other two of the four sidewalls are non-gated sidewalls. Digit lines are under the pillars. Carbon-doped silicon dioxide is adjacent and directly against the non-gated sidewalls. The carbon-doped silicon dioxide is adjacent and directly against sidewalls of the digit lines.

Some embodiments include a method of forming an integrated assembly. Rails of semiconductor material are formed, with each of the rails having a top surface and a pair of opposing sidewall surfaces extending downwardly from the top surface. The rails are spaced from one another by gaps. The rails extend along a first direction. A layer of carbon-doped silicon dioxide is formed to extend along and directly against the top surfaces and sidewall surfaces of each of the rails, and to extend along bottoms of the gaps between the rails. The carbon-doped silicon dioxide narrows the gaps. The narrowed gaps are filled with insulative material. Trenches are formed which extend along a second direction. The trenches slice the semiconductor material of the rails into pillars. Each of the pillars has a vertically-extending transistor channel region. Wordlines are formed within the trenches and along the pillars. The wordlines extend along the second direction. The wordlines are adjacent the vertically-extending transistor channel region of each of the pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming rails of semiconductor material; each of the rails having a top surface and a pair of opposing sidewall surfaces extending downwardly from the top surface; the rails being spaced from one another by gaps; the rails extending along a first direction;
   forming a layer of carbon-doped silicon dioxide to extend along and directly against the top surfaces and the sidewall surfaces of each of the rails, and to extend along bottoms of the gaps between the rails; the carbon-doped silicon dioxide narrowing the gaps;
   filling the narrowed gaps with insulative material;
   forming trenches which extend along a second direction; the trenches slicing the semiconductor material of the rails into pillars; each of the pillars having a vertically-extending transistor channel region; and
   forming wordlines within the trenches and along the pillars; the wordlines extending along the second direction; the wordlines being adjacent the vertically-extending transistor channel region of each of the pillars.

2. The method of claim 1 wherein the carbon-doped silicon dioxide has a carbon concentration within a range of from about 3% to about 20%, by volume.

3. The method of claim 2 wherein the layer of carbon-doped silicon dioxide has a thickness within a range of from about 10 Å to about 30 Å.

4. The method of claim 1 wherein the layer of carbon-doped silicon dioxide is a first layer of the carbon-doped silicon dioxide, and further comprising forming a second layer of the carbon-doped silicon dioxide along the pillars and the wordlines.

5. The method of claim 1 wherein the rails of semiconductor material are over digit-line rails, with said digit-line rails extending along the first direction; the digit-line rails having opposing sidewalls beneath the opposing sidewalls of the rails of semiconductor material; and wherein the layer of carbon-doped silicon dioxide is formed to extend along and directly against the sidewalls of the digit-line rails.

6. The method of claim 1 wherein the insulative material consists of silicon dioxide and is directly against the layer of carbon-doped silicon dioxide.

7. The method of claim 1 wherein each of the pillars includes an upper source/drain region over the channel region, and further comprising forming capacitors coupled with the upper source/drain regions.

* * * * *